(12) United States Patent
Tomasek et al.

(10) Patent No.: US 12,080,304 B2
(45) Date of Patent: Sep. 3, 2024

(54) AUDIO TRANSMITTER PROCESSOR, AUDIO RECEIVER PROCESSOR AND RELATED METHODS AND COMPUTER PROGRAMS FOR PROCESSING AN ERROR PROTECTED FRAME

(71) Applicant: Fraunhofer-Gesellschaft zur Foerderung der angewandten Forschung e.V., Munich (DE)

(72) Inventors: Adrian Tomasek, Erlangen (DE); Ralph Sperschneider, Erlangen (DE); Jan Büthe, Erlangen (DE); Alexander Tschekalinskij, Erlangen (DE); Manfred Lutzky, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 18/188,883

(22) Filed: Mar. 23, 2023

(65) Prior Publication Data

US 2023/0230606 A1    Jul. 20, 2023

Related U.S. Application Data

(60) Division of application No. 17/400,422, filed on Aug. 12, 2021, which is a continuation of application No. PCT/EP2020/053617, filed on Feb. 12, 2020.

(30) Foreign Application Priority Data

Feb. 13, 2019  (EP) ..................................... 19156997
Feb. 13, 2019  (EP) ..................................... 19157036

(Continued)

(51) Int. Cl.
  *H04L 1/00*   (2006.01)
  *G10L 19/022* (2013.01)
(Continued)

(52) U.S. Cl.
  CPC .......... *G10L 19/035* (2013.01); *G10L 19/022* (2013.01); *G10L 21/0324* (2013.01);
(Continued)

(58) Field of Classification Search
  CPC ... G10L 19/005; G10L 19/022; G10L 19/035; G10L 21/0324; G10L 19/02; G10L 25/93;
(Continued)

(56) References Cited

U.S. PATENT DOCUMENTS 5,148,271 A  9/1992  Kato et al.
5,712,861 A  1/1998  Inoue et al.
(Continued)

FOREIGN PATENT DOCUMENTS

CN   1343390 A   4/2002
CN   1732512 A   2/2006
(Continued)

OTHER PUBLICATIONS

ETSI TS 102 563 digital audio broadcasting DAB: transport of advanced audio coding(AAC) audio Technical Specification; May 2010.
(Continued)

*Primary Examiner* — Justin R Knapp
(74) *Attorney, Agent, or Firm* — Perkins Coie LLP; Michael A. Glenn

(57) ABSTRACT

An audio transmitter processor for generating an error protected frame using encoded audio data of an audio frame, the encoded audio data for the audio frame having a first amount of information units and a second amount of information units, has: a frame builder for building a codeword frame having a codeword raster, wherein the frame builder is configured to determine a border between a first amount of information units and a second amount of information units so that a starting information unit of the second amount
(Continued)

of information units coincides with a codeword border; and an error protection coder to obtain a plurality of processed codewords representing the error protected frame.

21 Claims, 20 Drawing Sheets

(30) Foreign Application Priority Data

| Feb. 13, 2019 | (EP) | ................................. | 19157042 |
| Feb. 13, 2019 | (EP) | ................................. | 19157047 |
| Jun. 11, 2019 | (WO) | ................. | PCT/EP2019/065172 |
| Jun. 11, 2019 | (WO) | ................. | PCT/EP2019/065205 |
| Jun. 11, 2019 | (WO) | ................. | PCT/EP2019/065209 |

(51) Int. Cl.

| G10L 19/035 | (2013.01) |
| G10L 21/0324 | (2013.01) |
| H03M 13/00 | (2006.01) |
| H03M 13/07 | (2006.01) |
| H03M 13/15 | (2006.01) |
| H04B 17/309 | (2015.01) |

(52) U.S. Cl.
CPC ....... *H03M 13/07* (2013.01); *H03M 13/1515* (2013.01); *H04B 17/309* (2015.01); *H04L 1/0009* (2013.01); *H04L 1/0032* (2013.01); *H04L 1/0042* (2013.01); *H04L 1/0045* (2013.01); *H04L 1/0046* (2013.01); *H04L 1/0084* (2013.01)

(58) Field of Classification Search
CPC .......................... H03M 13/07; H03M 13/1515; H04B 17/309; H04L 1/0009; H04L 1/0032; H04L 1/0041; H04L 1/0042; H04L 1/0045; H04L 1/0046; H04L 1/0047; H04L 1/0057; H04L 1/0083; H04L 1/0084; H04L 1/08
See application file for complete search history.

(56) References Cited

U.S. PATENT DOCUMENTS

| 5,852,469 | A | 12/1998 | Nagai et al. |
| 5,862,518 | A | 1/1999 | Nomura et al. |
| 6,256,064 | B1 | 7/2001 | Chujoh et al. |
| 6,256,487 | B1 | 7/2001 | Bruhn |
| 6,279,133 | B1 | 8/2001 | Vafai et al. |
| 6,301,558 | B1 | 10/2001 | Isozaki |
| 6,405,338 | B1 | 6/2002 | Sinha et al. |
| 6,975,254 | B1 | 12/2005 | Sperschneider et al. |
| 7,058,132 | B1 | 6/2006 | Sebire et al. |
| 7,266,750 | B1 | 9/2007 | Patapoutian et al. |
| 7,356,748 | B2 | 4/2008 | Taleb |
| 7,596,489 | B2* | 9/2009 | Kovesi .................. G10L 19/005 704/219 |
| 8,391,373 | B2* | 3/2013 | Virette .................. G10L 19/005 704/226 |
| 8,462,702 | B2* | 6/2013 | Jax ......................... H04N 19/30 370/477 |
| 8,798,172 | B2 | 8/2014 | Oh et al. |
| 9,026,434 | B2* | 5/2015 | Greer ..................... G10L 19/24 370/506 |
| 9,823,745 | B1 | 11/2017 | Fateh |
| 10,762,907 | B2 | 9/2020 | Tomasek et al. |
| 10,984,804 | B2 | 4/2021 | Lecomte et al. |
| 2002/0026616 | A1 | 2/2002 | Kikuchi et al. |
| 2002/0030612 | A1 | 3/2002 | Hetherington et al. |
| 2002/0072901 | A1 | 6/2002 | Bruhn |
| 2002/0080725 | A1 | 6/2002 | Bradley |
| 2002/0178418 | A1 | 11/2002 | Ramprashad et al. |
| 2003/0106009 | A1 | 6/2003 | Jarchi et al. |
| 2004/0128128 | A1 | 7/2004 | Wang et al. |
| 2005/0163234 | A1 | 7/2005 | Taleb |
| 2006/0104366 | A1 | 5/2006 | Huang et al. |
| 2006/0271355 | A1 | 11/2006 | Wang et al. |
| 2007/0065425 | A1 | 3/2007 | Behrens et al. |
| 2007/0086058 | A1 | 4/2007 | Ordentlich et al. |
| 2007/0121721 | A1 | 5/2007 | Kim et al. |
| 2007/0140359 | A1 | 6/2007 | Ehret et al. |
| 2007/0258651 | A1 | 11/2007 | Shin et al. |
| 2007/0271480 | A1 | 11/2007 | Oh et al. |
| 2007/0282600 | A1 | 12/2007 | Ojanpera |
| 2008/0071530 | A1 | 3/2008 | Ehara |
| 2008/0111719 | A1 | 5/2008 | Sperschneider et al. |
| 2008/0126096 | A1 | 5/2008 | Oh et al. |
| 2008/0126904 | A1 | 5/2008 | Sung et al. |
| 2008/0133242 | A1 | 6/2008 | Sung et al. |
| 2008/0301536 | A1 | 12/2008 | Shin et al. |
| 2009/0030675 | A1 | 1/2009 | Liebchen |
| 2009/0076807 | A1 | 3/2009 | Xu et al. |
| 2009/0209636 | A1 | 8/2009 | Raederstorff et al. |
| 2009/0281797 | A1 | 11/2009 | Zopf et al. |
| 2010/0023830 | A1 | 1/2010 | Wengerter et al. |
| 2010/0040153 | A1 | 2/2010 | Imanaka et al. |
| 2010/0080305 | A1 | 4/2010 | Guo et al. |
| 2010/0115370 | A1 | 5/2010 | Laaksonen et al. |
| 2011/0026848 | A1 | 2/2011 | Ordentlich et al. |
| 2011/0075753 | A1 | 3/2011 | Jung et al. |
| 2011/0138258 | A1 | 6/2011 | Okamura et al. |
| 2011/0170711 | A1 | 7/2011 | Rettelbach et al. |
| 2011/0173009 | A1 | 7/2011 | Fuchs et al. |
| 2011/0191111 | A1 | 8/2011 | Chu et al. |
| 2011/0320901 | A1 | 12/2011 | Sato et al. |
| 2012/0271644 | A1 | 10/2012 | Bessette et al. |
| 2013/0187798 | A1 | 7/2013 | Marpe et al. |
| 2013/0254615 | A1 | 9/2013 | Vijayasankar et al. |
| 2013/0332152 | A1 | 12/2013 | Lecomte et al. |
| 2014/0012589 | A1 | 1/2014 | Oh et al. |
| 2014/0063062 | A1 | 3/2014 | Fateh |
| 2014/0142957 | A1 | 5/2014 | Sung et al. |
| 2014/0310010 | A1 | 10/2014 | Seo et al. |
| 2015/0142452 | A1 | 5/2015 | Sung et al. |
| 2015/0181194 | A1 | 6/2015 | Izawa et al. |
| 2016/0171740 | A1 | 6/2016 | Yerli |
| 2016/0247506 | A1 | 8/2016 | Lecomte et al. |
| 2016/0266699 | A1 | 9/2016 | Zhao et al. |
| 2016/0285718 | A1 | 9/2016 | Bruhn |
| 2016/0322060 | A1 | 11/2016 | Riedmiller et al. |
| 2017/0004835 | A1 | 1/2017 | Schnabel et al. |
| 2017/0094295 | A1 | 3/2017 | Gu |
| 2017/0169833 | A1 | 6/2017 | Lecomte et al. |
| 2018/0026663 | A1 | 1/2018 | Wu et al. |
| 2018/0122386 | A1 | 5/2018 | Sung et al. |
| 2018/0234115 | A1 | 8/2018 | Noh et al. |
| 2018/0358023 | A1 | 12/2018 | Sasaki |
| 2019/0005965 | A1 | 1/2019 | Lecomte et al. |
| 2019/0005966 | A1 | 1/2019 | Lecomte et al. |
| 2019/0005967 | A1 | 1/2019 | Lecomte et al. |
| 2019/0051311 | A1 | 2/2019 | Sung et al. |

FOREIGN PATENT DOCUMENTS

| CN | 101174931 A | 5/2008 |
| CN | 101218630 A | 7/2008 |
| CN | 101261833 A | 9/2008 |
| CN | 101331733 A | 12/2008 |
| CN | 101569198 A | 10/2009 |
| CN | 102034478 A | 4/2011 |
| CN | 102057424 A | 5/2011 |
| CN | 102163430 A | 8/2011 |
| CN | 102165782 A | 8/2011 |
| CN | 103597544 A | 2/2014 |
| CN | 103688306 A | 3/2014 |
| CN | 104021769 A | 9/2014 |
| CN | 104885149 A | 9/2015 |
| CN | 107077851 A | 8/2017 |
| CN | 108711431 A | 10/2018 |
| CN | 108885875 A | 11/2018 |

(56) References Cited

FOREIGN PATENT DOCUMENTS

| | | |
|---|---|---|
| CN | 109155133 A | 1/2019 |
| CN | 109313905 A | 2/2019 |
| EP | 0170328 A1 | 2/1986 |
| EP | 0732855 A2 | 9/1996 |
| EP | 0798888 A2 | 10/1997 |
| EP | 0936772 A2 | 8/1999 |
| EP | 1155498 B1 | 3/2004 |
| EP | 2270777 A2 | 1/2011 |
| EP | 3011559 B1 | 7/2017 |
| EP | 3230980 A1 | 10/2017 |
| GB | 2253123 A | 8/1992 |
| IN | 201637013771 A | 8/2016 |
| JP | H04219033 A | 8/1992 |
| JP | H06202696 A | 7/1994 |
| JP | H06204983 A | 7/1994 |
| JP | H1022937 A | 1/1998 |
| JP | H11317675 A | 11/1999 |
| JP | 2998254 B2 | 1/2000 |
| JP | 2000123083 A | 4/2000 |
| JP | 2000227756 A | 8/2000 |
| JP | 3328093 B2 | 9/2002 |
| JP | 2003289539 A | 10/2003 |
| JP | 2005006289 A | 1/2005 |
| JP | 2006287551 A | 10/2006 |
| JP | 2009276890 A | 11/2009 |
| JP | 2009538460 A | 11/2009 |
| JP | 2010503352 A | 1/2010 |
| JP | 2010511201 A | 4/2010 |
| JP | 4841789 B2 | 10/2011 |
| JP | 2012242785 A | 12/2012 |
| JP | 5186054 B2 | 1/2013 |
| JP | 2017097326 A | 6/2017 |
| KR | 10-2001-0108051 A | 12/2001 |
| KR | 20060094105 A | 8/2006 |
| KR | 20060101889 A | 9/2006 |
| KR | 10-2007-0110311 A | 11/2007 |
| KR | 10-2015-0099615 A | 8/2015 |
| RU | 2239950 C2 | 11/2004 |
| RU | 2408089 C9 | 4/2011 |
| RU | 2610588 C2 | 2/2017 |
| TW | 200743388 A | 11/2007 |
| TW | 201116058 A | 5/2011 |
| TW | 201248616 A | 12/2012 |
| TW | 201521016 A | 6/2015 |
| TW | 201528255 A | 7/2015 |
| TW | 201539433 A | 10/2015 |
| TW | 201724085 A | 7/2017 |
| TW | 201813322 A | 4/2018 |
| WO | 9711535 A1 | 3/1997 |
| WO | 03065755 A1 | 8/2003 |
| WO | 2005086436 A1 | 9/2005 |
| WO | 2007008007 A1 | 1/2007 |
| WO | 2007084475 A2 | 7/2007 |
| WO | 2010000303 A1 | 1/2010 |
| WO | 2010088625 A1 | 8/2010 |
| WO | 2010103607 A1 | 9/2010 |
| WO | 2011103678 A1 | 9/2011 |
| WO | 2012141486 A2 | 10/2012 |
| WO | 2012158159 A1 | 11/2012 |
| WO | 2014072260 A2 | 5/2014 |
| WO | 2016091893 A1 | 6/2016 |
| WO | 2017153006 A1 | 9/2017 |
| WO | 2017153299 A2 | 9/2017 |

OTHER PUBLICATIONS

3GPP , "Codec for Enhanced Voice Services (EVS)", General Overview. Technical specification, 2015.
3GPP TS 26.441 , "Codec for Enhanced Voice Services (EVS); General Overview", 3GPP TS 26.441 V13.0.0 (Dec. 2015), Dec. 2015, 12 pp.
Boltze, Thomas , et al., "Audio services and applications 1 of 2", International Symposium on Digital Audio Broadcasting, No. ED. 2, XP003011836, pp. 75-125.
Boltze, Thomas , et al., "Audio services and applications 2 of 2", International Symposium on Digital Audio Broadcasting, No. ED. 2, XP003011836, pp. 75-125.
ETSI ES , "Digital Radio Mondiale; System Specification", ETSI ES 201 980 v.4.1.1 (Jan. 2014), Jan. 2014, 195 pp.
ETSI Standard , "[Part 1 of 13] Digital Radio Mondiale; System Specification", ETSI ES 201 980 V4.1.1 (Jan. 2014) (195 pp.), Jan. 2014, pp. 1-14.
ETSI Standard , "[Part 10 of 13] Digital Radio Mondiale; System Specification", ETSI ES 201 980 V4.1.1 (Jan. 2014) (195 pp.), Jan. 2014, pp. 139-154.
ETSI Standard , "[Part 11 of 13] Digital Radio Mondiale; System Specification", ETSI ES 201 980 V4.1.1 (Jan. 2014) (195 pp.), Jan. 2014, pp. 155-170.
ETSI Standard , "[Part 12 of 13] Digital Radio Mondiale; System Specification", ETSI ES 201 980 V4.1.1 (Jan. 2014) (195 pp.), Jan. 2014, pp. 171-187.
ETSI Standard , "[Part 13 of 13] Digital Radio Mondiale; System Specification", ETSI ES 201 980 V4.1.1 (Jan. 2014) (195 pp.), Jan. 2014, pp. 188-195.
ETSI Standard , "[Part 2 of 13] Digital Radio Mondiale; System Specification", ETSI ES 201 980 V4.1.1 (Jan. 2014) (195 pp.), Jan. 2014, pp. 15-26.
ETSI Standard , "[Part 3 of 13] Digital Radio Mondiale; System Specification", ETSI ES 201 980 V4.1.1 (Jan. 2014) (195 pp.), Jan. 2014, pp. 27-39.
ETSI Standard , "[Part 4 of 13] Digital Radio Mondiale; System Specification", ETSI ES 201 980 V4.1.1 (Jan. 2014) (195 pp.), Jan. 2014, pp. 40-54.
ETSI Standard , "[Part 5 of 13] Digital Radio Mondiale; System Specification", ETSI ES 201 980 V4.1.1 (Jan. 2014) (195 pp.), Jan. 2014, pp. 55-70.
ETSI Standard , "[Part 6 of 13] Digital Radio Mondiale; System Specification", ETSI ES 201 980 V4.1.1 (Jan. 2014) (195 pp.), Jan. 2014, pp. 71-83.
ETSI Standard , "[Part 7 of 13] Digital Radio Mondiale; System Specification", ETSI ES 201 980 V4.1.1 (Jan. 2014) (195 pp.), Jan. 2014, pp. 84-102.
ETSI Standard , "[Part 8 of 13] Digital Radio Mondiale; System Specification", ETSI ES 201 980 V4.1.1 (Jan. 2014) (195 pp.), Jan. 2014, pp. 103-120.
ETSI Standard , "[Part 9 of 13] Digital Radio Mondiale; System Specification", ETSI ES 201 980 V4.1.1 (Jan. 2014) (195 pp.), Jan. 2014, pp. 121-138.
ETSI TR , "ETSI TR 103590 V1.1.1 (Sep. 2018), "Digital Enhanced Cordless Telecommunications (DECT)", Study of Super Wideband Codec in DECT for narrowband, wideband and super-wideband audio communication including options of low delay audio connections (lower than 10 ms framing)", Sep. 2018.
ETSI TS 102 563 , "Digital Audio Broadcasting (DAB)", Transport of Advanced Audio Coding (AAC) Audio, ETSI vol. BROADCAS, No. V1.2.1, May 1 2010, XP014046351, May 2010.
Fairhurst, G , et al., "Smart Codec: An Adaptive Packet Data Link", IEE Proceedings: Communications, Institution of Electrical Engineers, GB, (Jun. 1, 1998), XP000766291, vol. 145, No. 3, pp. 180-185.
Hoeve, H , et al., "Fehlerkorrektur im Compact Disc Digital Audio-System", NTZ Nachrichtentechnische Zeitschrift, VDE Verlag GmbH, vol. 36, No. 7, XP009521920, pp. 446-448.
ISO/IEC , "Part 1 of 3—Information technology Coding of audiovisual objects, Part 3: Audio", ISO/IEC 14496-3-MPEG-4 Information technology, Standard, International Organization for Standardization, Geneva, CH, 2009, 1416 pp.
ISO/IEC , "Part 2 of 3—Information technology Code of audiovisual objects, Part 3: Audio", ISO/IEC 14496-3-MPEG-4 Information technology, Standard, International Organization for Standardization, Geneva, CH, 2009.
ISO/IEC , "Part 3 of 3—Information technology Coding of audiovisual objects, Part 3: Audio", ISO/IEC 14496-3-MPEG—Information technology, Standard, International Organization for Standardization, Geneva, CH, 2009.

(56) References Cited

OTHER PUBLICATIONS

Jacaba, Joebert S, "Audio Compression Using Modified Discrete Cosine Transform—The MP3 Coding Standard—1 of 2", Undergraduate research paper, XP055359704, 2001, pp. 1-83.

Jacaba, Joebert S, "Audio Compression Using Modified Discrete Cosine Transform—The MP3 Coding Standard—2 of 2", Undergraduate research paper, XP055359704, 2001, pp. 1-83.

Kamamoto, Yutaka, et al., "Trend of High sound quality audio coding technology for VoLTE", Journal of the Acoustic Society of Japan, vol. 74, No. 2, with English translation, pp. 83-92.

Lauber, Pierre, et al., "Error Concealment for Compressed Digital Audio", in Audio Engineering Society, XP008075936.

Moon, Todd K, "Error Correction Coding: Mathematical Methods and Algorithms", Wiley-Interscience, 2005, 2005, 39 pp.

Perkins, Colin, et al., "A Survey of Packet Loss Recovery Techniques for Streaming Audio", IEEE vol. 12, No. 5, XP000875014, pp. 40-48.

Rämö, Anssi, et al., "EVS Channel Aware Mode Robustness to Frame Erasures", in Interspeech 2016, San Francisco, CA, USA.

Rose, Kenneth, et al., "A Frame Loss Concealment Technique for MPEG-AAC", AES Convention 120, XP040507556.

Rose, Kenneth, et al., "Frame Loss Concealment for Audio Decoders Employing Spectral Band Replication", AEL Convention 121, XP040507885.

Sperschneider, Ralph, et al., "Error Resilient Source Coding with Differential Variable Length Codes and its Application to MPEG Advance Audio Coding", Audio Engineering Societey, Munich, 2002, 19 pp.

Taleb, Anisse, et al., "Partial Spectral Loss Concealment in Transform Coders", IEEE Conference on Acoustics, Speech, And Signal Processing, vol. 3, XP010792360, pp. 185-188.

Venkatraman, A, et al., "Improved Error Resilience for VoLTE and VoIP with 3GPP EVS Channel Aware Coding", in ICASSP.

ETSI TS 102 563 V1.1.1, Digital Audio Broadcasting (DAB) Transport of Advanced Audio Coding (AAC) audio (Feb. 2007).

Dun, Yujie, et al., "An extrapolation method for MDCT domain frame loss concealment", 2014 IEEE China Summit & International Conference on Signal and Information Processing (ChinaSIP). IEEE, 2014, pp. 650-654 (Year: 2014).

ETSI TS 102 563 V1.1.1, Digital Audio Broadcasting (DAB) Transport of Advanced Audio Coding (AAC) audio (Feb. 2007) (26 pages).

\* cited by examiner example of original LC3 bitstream payload distribution of bits of the example LC3 bitstream payload given in Fig. 1 based on their psychoacoustic relevancy Fig. 3    example of LC3 bitstream payload arrangement Fig. 4  example of LC3 bitstream payload rearrangement with arithmetic encoder/decoder operating on byte granularity (DIRECT WRITING)

(REARRANGING)

(REARRANGING)

(DIRECT DECODING)

AUDIO TRANSMITTER PROCESSOR, AUDIO RECEIVER PROCESSOR AND RELATED METHODS AND COMPUTER PROGRAMS FOR PROCESSING AN ERROR PROTECTED FRAME

CROSS-REFERENCE TO RELATED APPLICATIONS

This application is a divisional of U.S. patent application Ser. No. 17/400,422, filed Aug. 12, 2021, which is a continuation of copending International Application No. PCT/EP2020/053617, filed Feb. 12, 2020, which is incorporated herein by reference in its entirety, and additionally claims priority from European Application No. 19157036.5, filed Feb. 13, 2019, from European Application No. 19156997.9, filed Feb. 13, 2019, from European Application No. 19157042.3, filed Feb. 13, 2019, and from European Application No. 19157047.2, filed Feb. 13, 2019, and from International Application PCT/EP2019/065205, filed Jun. 11, 2019, from International Application PCT/EP2019/065209, filed Jun. 11, 2019, and from International Application PCT/EP2019/065172, filed Jun. 11, 2019, all of which are incorporated herein by reference in their entirety.

BACKGROUND OF THE INVENTION

The present invention is related to audio processing and, particularly, to audio processing applications that are useful in the context of error-prone transmission channels such as wireless channels.

U.S. Pat. No. 5,852,469 discloses a moving picture coding and/or decoding system and a variable length coding and/or decoding system. The encoder has a divider for dividing a code stream supplied from the encoder into a plurality of code strings and a reorderer for arranging at least one of the plurality of code strings in the forward direction from the head to the end and at least one of the other code strings in the backward direction from the end to the head. A variable-length coding system includes a codeword table for storing a plurality of codewords so that the codewords correspond to source symbols. And an encoder selects a codeword corresponding to the source symbol input from the codeword table and for outputting the selected codeword as coded data. The plurality of codewords can be decoded in either of the forward and backward directions. The plurality of codewords are configured so that the pause between codes can be detected by a predetermined weight of the codeword, in the case of a binary code, the number of "1" or "0" in the codeword.

EP 1155498 B1 discloses a concept for producing or reading a data stream that comprises a multitude of raster points as reference points, wherein at least a part of each codeword of a first set is written in a first direction of writing starting at the raster point of a segment, and at least a part of a codeword of a second set of codewords is written into the data stream in a second direction of writing which is opposite to the first direction of writing, starting from a second raster point of a segment. In case that a codeword of the second set does not or not completely fit into a segment, at least a part of this codeword or a part of the remainder of this codeword which does not fit into the assigned segment is written into a different, not fully occupied segment, in accordance with a predetermined rule.

This procedure makes sure that an error propagation is limited to the space between two raster points.

MPEG-4 Part 3 Audio [1] defines BSAC, which uses bit sliced arithmetic coding, where psychoacoustic relevancy decreases linearly over the audio frame.

MPEG-4 Part 3 Audio [1] defines error sensitivity categories for the bitstream payload of AAC (Table 4.94 in [1]):

| category | payload | mandatory | leads/may lead to one instance per | Description |
|---|---|---|---|---|
| 0 | main | yes | CPE/stereo layer | commonly used side information |
| 1 | main | yes | ICS | channel dependent side information |
| 2 | main | no | ICS | error resilient scale factor data |
| 3 | main | no | ICS | TNS data |
| 4 | main | yes | ICS | spectral data |
| 5 | extended | no | EPL | extension type/ data_element_version |
| 6 | extended | no | EPL | DRC data |
| 7 | extended | no | EPL | bit stuffing |
| 8 | extended | no | EPL | ANC data |
| 9 | extended | no | EPL | SBR data |

Related data is subsequently stored in instances of corresponding error sensitivity classes to form an ER AAC payload, which may subsequently be protected individually using forward error correction or detection means. A fix assignment of data elements into categories is specified. Due to entropy coding, this leads to classes of variable lengths. Those lengths need to be transmitted to allow the decoding of the ER AAC payload, which causes additional overhead.

DRM [2] defines super frames for the bitstream payload of AAC to allow unequal error protection (aac_super_frame). A super frame consists of a predefined number (either 5 or 10) AAC frames. It is assumed, that the psychoacoustically more important bits of an AAC frame are available at the beginning of the bitstream payload. Therefore, the first N bits (e.g. 200 bits) are cut from each frame and are consecutively stored at the beginning of the super frame. Those bits are subsequently protected by a CRC. The remaining bits of those frames are stored afterwards without protection. Since always a fix amount of data is treated as sensitive, no length information needs to be transmitted in order to decode the protected payload (of course, lengths information for the individual frames of a super frame is needed, but this is out of scope for the current consideration).

The frame generated by BSAC as described in MPEG-4 Part 3 Audio comes already sorted by psychoacoustic relevancy; it starts with the most important bits and ends with the least important bits. This comes by the cost of higher computational complexity for arithmetical en-/decoding of all bits of the spectral lines.

Due to the nature of the approach for AAC as described in MPEG-4 Part 3, the instances of the various error sensitivity categories are of variable lengths. This is no issue for convolutional codes, but is inappropriate for block codes, which use a fix amount of data to be protected.

The DRM approach just works, if the bitstream payload is already arranged based on the psychoacoustic importance of the individual bits.

It is an object of the present invention to provide an improved and nevertheless efficient concept for generating an error protected frame or for processing a received error protected frame.

SUMMARY

According to an embodiment, an audio transmitter processor for generating an error protected frame using encoded audio data of an audio frame, the encoded audio data for the audio frame having a first amount of information units and a second amount of information units, may have: a frame builder for building a codeword frame having a codeword raster defining reference positions for a predefined total number of codewords, wherein the frame builder is configured to write the information units of the first amount of information units starting at reference positions of a first predefined subset of the codewords; and to write the information units of the second amount of information units starting at reference positions of a second predefined subset of the codewords, wherein the frame builder is configured to determine a border between the first amount of information units and the second amount of information units so that a starting information unit of the second amount of information units coincides with a codeword border; and an error protection coder for processing one or more of the codewords of the first predefined subset of the codewords to obtain a first processing result or for processing one or more of the codewords of the second predefined subset of the codewords to obtain a second processing result and for adding the first processing result or the second processing result to the predefined number of codewords to obtain a plurality of processed codewords representing the error protected frame, or for processing the codewords of the first predefined subset of the codewords or of the second predefined subset of the codewords individually to obtain a plurality of processed codewords representing the error protected frame.

According to another embodiment, an audio receiver processor for processing an error protected frame may have: a receiver interface for receiving the error protected frame to obtain a received error protected frame; an error protection processor for processing the received error protected frame to obtain an encoded audio frame, wherein the error protection processor is configured to check whether a codeword of a first predefined subset of codewords of the encoded audio frame has an error, and an error concealer or an error concealment indicator configured to perform a frame loss concealment operation or to generate a frame loss concealment indication in case of a detected error in the first predefined subset of the codewords.

According to still another embodiment, a method of generating an error protected frame using encoded audio data of an audio frame, the encoded audio data for the audio frame having a first amount of information units and a second amount of information units, may have the steps of: building a codeword frame having a codeword raster defining reference positions for a predefined total number of codewords, wherein the building may have: writing the information units of the first amount of information units starting at reference positions of a first predefined subset of the codewords; and writing the information units of the second amount of information units starting at reference positions of a second predefined subset of the codewords, determining a border between the first amount of information units and the second amount of information units so that a starting information unit of the second amount of information units coincides with a codeword border; and performing an error protection processing having: processing one or more of the codewords of the first predefined subset of the codewords to obtain a first processing result or processing one or more of the codewords of the second predefined subset of the codewords to obtain a second processing result and adding the first processing result or the second processing result to the predefined number of codewords to obtain a plurality of processed codewords representing the error protected frame, or processing the codewords of the first predefined subset of the codewords or of the second predefined subset of the codewords individually to obtain a plurality of processed codewords representing the error protected frame.

According to another embodiment, a method of processing an error protected frame may have the steps of: receiving the error protected frame to obtain a received error protected frame; performing an error protection processing with the received error protected frame to obtain an encoded audio frame, wherein the error protection processing has checking whether a codeword of a first predefined subset of codewords of the encoded audio frame has an error, and performing a frame loss concealment operation in case of a detected error in the first predefined subset of the codewords.

Another embodiment may have a non-transitory digital storage medium having stored thereon a computer program for performing a method of generating an error protected frame using encoded audio data of an audio frame, the encoded audio data for the audio frame having a first amount of information units and a second amount of information units, having the steps of: building a codeword frame having a codeword raster defining reference positions for a predefined total number of codewords, wherein the building may have: writing the information units of the first amount of information units starting at reference positions of a first predefined subset of the codewords; and writing the information units of the second amount of information units starting at reference positions of a second predefined subset of the codewords, determining a border between the first amount of information units and the second amount of information units so that a starting information unit of the second amount of information units coincides with a codeword border; and performing an error protection processing having: processing one or more of the codewords of the first predefined subset of the codewords to obtain a first processing result or processing one or more of the codewords of the second predefined subset of the codewords to obtain a second processing result and adding the first processing result or the second processing result to the predefined number of codewords to obtain a plurality of processed codewords representing the error protected frame, or processing the codewords of the first predefined subset of the codewords or of the second predefined subset of the codewords individually to obtain a plurality of processed codewords representing the error protected frame, when said computer program is run by a computer.

Another embodiment may have a non-transitory digital storage medium having stored thereon a computer program for performing a method of processing an error protected frame having the steps of: receiving the error protected frame to obtain a received error protected frame; performing an error protection processing with the received error protected frame to obtain an encoded audio frame, wherein the error protection processing has checking whether a codeword of a first predefined subset of codewords of the encoded audio frame has an error, and performing a frame loss concealment operation in case of a detected error in the first predefined subset of the codewords, when said computer program is run by a computer.

An audio transmitter processor for generating an error protected frame uses encoded audio data corresponding to an audio frame, where this encoded audio data comprises a first amount of information units such as bits or bytes and a second amount of information units. A frame builder builds a frame having a codeword raster defining reference positions for a predefined total number of codewords, where the frame builder is configured to write the information units of the first amount of information units starting at reference positions of a first predefined subset of the codewords and to write the information units of the second amount of information units starting at reference positions of a second predefined subset of the codewords, where the frame builder determines a border between the first amount of information units and the second amount of information units so that a starting information unit of the second amount of information units coincides with a codeword border. The audio transmitter processor has an error protection coder for processing the predefined total number of codewords individually to obtain a plurality of processed codewords representing the error protected frame and/or for processing one or more of the codewords of the first predefined subset to obtain a first processing result and/or for processing one or more of the codewords of the second predefined subset to obtain a second processing result and for adding the first processing result or the second processing result to the predefined number of codewords to obtain the plurality of processed codewords.

On the receiver side, an audio receiver processor for processing a received error protected frame comprises a receiver interface for receiving the error protected frame. The audio receiver processor comprises an error protection processor for processing the error protected frame to obtain an encoded audio frame. Particularly, the error protection processor is configured to check whether a first predefined subset of the codewords of the encoded audio frame comprises an error. The audio receiver processor comprises an error concealer or error concealment indicator configured to perform a (full) frame loss concealment operation in case of a detected error in the first predefined subset of the codewords or to generate and forward an error concealment indication indicating the frame loss concealment operation to be done at a remote place.

Due to the separate processing of the first predefined subset of the codewords on the one hand and the second predefined subset of the codewords on the other hand and by using the information on the first predefined subset of the codewords on the receiver side, a very efficient processing with respect to the generation of an error protected frame and a processing with respect to the error checking is obtained, since the predefined subset of the codewords of the first set is predefined and, therefore, known to the decoder without any specific additional signalization such as signalization bit per frame or so. This is not required; instead, because the encoder uses a predefined subset of first codewords for writing the first amount of information units and since the receiver or audio receiver processor relies on this predefinition, an efficient error protection on the one hand and efficient error checking on the other hand is made available.

Advantageously, the error protection processing on the reception side allows a separate calculation of a processing result such as a Hash value on two or more of the first subset of the codewords but not any codeword from the second set and, at the same time, the calculation of a Hash value only from the codewords of the second predefined subset of the codewords without any codewords from the first set allows an efficient error checking processing on the decoder side, since only a certain amount rather than all codewords is used for Hash verification. Very early in the receiver processing, it can be determined whether serious errors have occurred in the frame that, in the end, result in a requirement for a full frame loss concealment operation, or whether only relatively less important audio data have been affected by transmission errors so that only a much higher quality partial frame loss concealment operation or no concealment operation at all is necessary for addressing this type of error.

Due to the fact that the present invention forms a bridge between audio encoding on the one hand and error protection processing on the other hand via the specific frame building operation, very efficient and very high quality and smart error processing procedure can be applied on the decoder side due to the separate error protection processing for the first predefined subset of the codewords having the first amount of data and the second predefined subset of the codewords having the second amount of data. Advantageously, the first amount of data are psychoacoustically more important data or are side information and optional TNS data and most and least significant bits of lower spectral values while the second amount of data typically comprises most and least significant bits of higher frequencies that are not so decisive for the audio perception from a psychoacoustic point of view. Further information units that are typically in the second amount of information units are residual data that are generated provided that the bit consumption by the arithmetic encoder has not fully consumed the available bit budget.

Particularly, the writing of the first amount of information units and the second amount of information units into first and second predefined subsets, where a border between the first amount of information units and the second amount of information units is placed at a codeword border makes sure that a clear separation is found between codewords that are more important, i.e., the first predefined subset of the codewords compared to codewords that are less important such as the second predefined subset of the codewords. In a scenario where the coding operation applied by the audio coder is a signal-dependent coding operation that, in the end, results in a variable length result of audio data for a frame that is adapted to a fixed frame raster by controlling the coding operation and by calculating additional residual bits, for example, the border between the first amount of information units and the second amount of information units dynamically changes from frame to frame. Nevertheless, the psychoacoustically more important data such as low frequency data are included in the first predefined subset and, therefore, on the transmitter side, only a check of the first predefined subset of the codewords results in a situation, where a full frame loss concealment is to be performed while, as soon as it has been determined on the receiver side that the first predefined subset of the codewords has been received without any errors, only then a further processing such as a check of the second predefined subset of the codewords is to be done. Therefore, as soon as it is determined that the first predefined subset of the codewords has an error, a full frame loss concealment operation such as a repetition of an earlier frame or a modified repetition of a preceding frame or anything like that is performed without spending any resources for further processing the received erroneous frame.

The receiver processor comprises a frame reader for reading the encoded audio frame in accordance with a predefined frame reading procedure identifying the first predefined subset of the codewords and the second predefined subset of the codewords. Any audio data processing order that has been applied by the encoder side frame builder can be undone/rearranged or is, for a direct reading procedure, known to the decoder so that the decoder can parse the received frame at least with respect to the first predefined subset, when an error-free condition has been detected for this first predefined subset and even for the second predefined subset, in case an error-free condition of the second predefined subset has been determined as well.

The frame reader typically only has to be activated subsequent to the determination of an error-free situation of the first predefined subset of the codewords. The error protection processor only has to know the location of the first predefined subset of the codewords in the data frame output by the error protection processor but does not have to know, for the purpose of error checking, in which directions any data has been written into the corresponding positions represented by the codewords.

Advantageously, psychoacoustically less important data are located at specific positions in the frame which can be at the left border of the frame or at the right border of the frame or at a predefined number of codewords/reference positions within the frame. It is desirable to separate psychoacoustically more important data from the psychoacoustically less important data or it is needed to rearrange psychoacoustically more important data and psychoacoustically less important data within an audio frame.

A rearrangement is, for example, used to align the data to a given error protection and detection scheme, when the frame of encoded audio data is generated by a predefined and standardized audio decoder that is not yet customized to cooperate with a certain error protection processor. This rearrangement allows individual frame loss concealment procedures depending on the availability of the psychoacoustically more important data and the psychoacoustically less important data.

BRIEF DESCRIPTION OF THE DRAWINGS

Embodiments of the present invention are subsequently discussed with respect to the accompanying drawings in which.

DETAILED DESCRIPTION OF THE INVENTION

Figure 1:
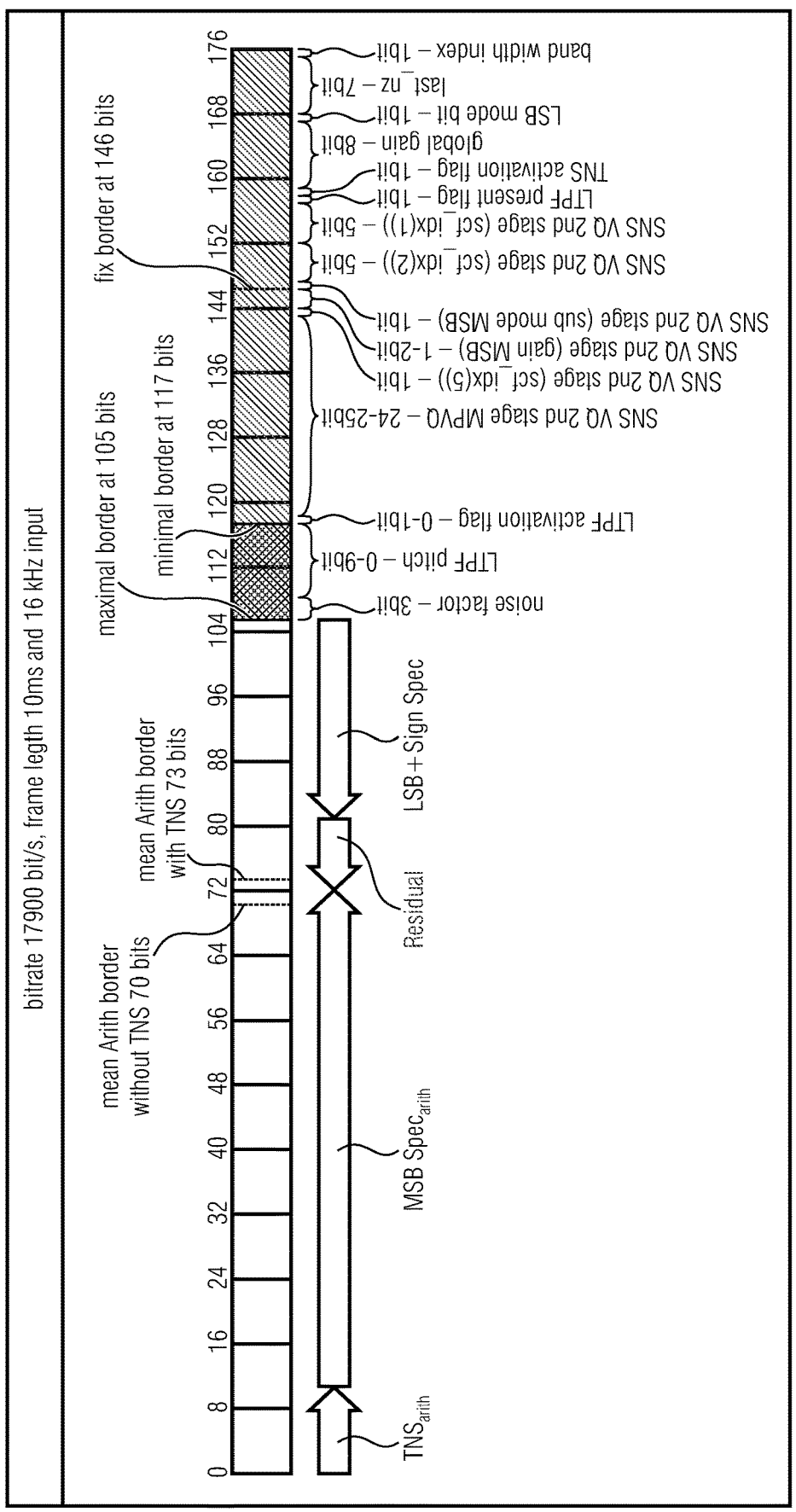
FIG. 1 is an illustration of an example of an originally LC3 bitstream payload.

Subsequently, implementations of the present invention in certain contexts are discussed.

The bits are written chronologically—but not spatially—during the encoding process based on their psychoacoustic relevancy. The most important data are written first, the least important data are written last. However, the position of the psychoacoustically less important bits within a 'normal' audio frame may vary from frame to frame depending on the underlying coded data. This might be for example due to writing the data into the frame from both sides, whereas from one side arithmetically coded data is written and from the other side data coded by other means is written simultaneously. An example for such an approach is the LC3 codec.

A system with two classes of bits is envisioned. The subdivision of the bitstream payload into two classes is done based on their relevancy relative to the output:

Bits, which are psychoacoustically less important—their distortion allows partial frame loss concealment, are put into one class;

Bits, which are psychoacoustically more important—their distortion uses full frame loss concealment, are put into another class.

Reason for doing so is that—depending on the availability of the two classes—different concealment strategies are envisioned. Those two different concealment strategies are referred to subsequently as full frame loss concealment and partial frame loss concealment:

Full frame loss concealment takes place, if the class covering the psychoacoustically more important bits is lost. The availability of the class covering the psychoacoustically less important bits does not matter—its data is not evaluated. In that case, no data of the current frame is available, so the frame is synthesized completely based on the last received frame.

Partial frame loss concealment may take place, if the class covering the psychoacoustically more important bits is available, but the class covering the psychoacoustically less important data is lost. In that case, the psychoacoustically more important data is available and can be used to reconstruct the frame—just the psychoacoustically less important data needs to be synthesized based on the last fully received frame. Partial frame loss concealment is meant to provide better quality (i.e. less artifacts) than full frame loss concealment under many circumstances.

The sizes of the two classes are predefined, e.g. by the channel coder.

The forward error detection and correction scheme advantageously utilizes Reed-Solomon codes and works on a codeword granularity, whereas each codeword consists of multiple nibbles (4 bits, also called semi-octets). In the present case (LC3), one codeword consists of 13 to 15 nibbles. In an embodiment, such forward error detection and correction scheme offers various degrees of error detection and correction, depending on the overhead being spent, e. g.
- 4 nibbles overhead per codeword allow 2 nibbles to be corrected (error protection mode 3);
- 6 nibbles overhead per codeword allow 3 nibbles to be corrected (error protection mode 4).

For a given gross bitrate, the net bitrate depends on the chosen error protection mode—the higher the error detection and correction capability, the smaller the available net bitrate.

Individual error detection is used for both classes. Considering the given channel coding configuration, it is of advantage to store all bits of one class into a certain number of codewords, and all bits of the other class into the remaining number of codewords.

The subdivision of the bits within the bitstream payload into classes is made such, that always a certain number of codewords comprises the bits of one class, whereas the remaining number of codewords comprises the bits of the other class.

As stated before, the position of the psychoacoustically less important bits may vary from frame to frame depending on the underlying coded data.

However, the goal is to have a certain amount of psychoacoustically less important bits separated for rearrangement (allowing individual error protection and detection in combination with fix codeword sizes and positions provided by the channel codec).

The rearrangement has to be done adaptively on a frame-by-frame basis. For such rearrangement, no additional side information (e.g. length information) shall be used to revert the rearrangement or to decode the rearranged bitstream payload.

A bitstream payload is usually written such, that writing and reading routines can be implemented in an efficient way. The psychoacoustic importance plays usually no role, which may lead to a bitstream payload, where psychoacoustically less important bits and psychoacoustically more important bits are mixed. In order to allow an efficient forward error protection in the context of the given requirements mentioned before, such a bitstream payload is suboptimal and entails rearrangement.

Since the position of the psychoacoustically less important bits may vary from frame to frame depending on the underlying coded data, no direct mapping to the fixed codeword sizes and positions is possible. Therefore,—in a straightforward approach—the related bits are rearranged as follows:
- psychoacoustically less important bits are stored at one end of the presorted bitstream payload.
- psychoacoustically more important bits are stored at the other end of the presorted bitstream payload.

The number of the psychoacoustically less important bits is statically derived based on an error protection mode and the size of the channel-encoded frame.

However, the location of the psychoacoustically less important bits is dynamically derived. Adaptive rearrangement rules are predefined, such that no additional side information is needed to repeal the rearrangement at the decoder side. The adaptation rules make sure, that the psychoacoustically least important bits are always stored at the far end of the chosen side of the bitstream, and assure at the same time, that the decoder knows exactly, how to restore the original bitstream payload.

On one hand, such rearrangement can be done as a post-processing step, after the 'normal' bitstream payload has been completely written by the encoder—and as a pre-processing step after decoding the side information (which is never part of the rearrangement), before the remaining 'normal' payload is read by the decoder.

On the other hand, such rearrangement can also be done during the encoding process, writing the encoded bits directly at the appropriate position—and during the decoding process, reading the bits directly from the appropriate position.

It is noted, that any assignment of the psychoacoustically less and the psychoacoustically more important bits to dedicated codewords is possible. The assignment of the psychoacoustically less important bits to the left-most codewords and the assignment of the psychoacoustically more important bits to the right-most codewords is just one embodiment. Accordingly, the rearrangement could also be done differently, depending on the chosen assignment. The only prerequisite is that the assignment is predefined, such that the decoder can revert the process without additional information in the bitstream.

The following application scenarios are considerable:
1. The audio frame shall be written such, that the psychoacoustically less important bits are collected on one end of the bitstream:
   a. Start writing into the area provided for the more significant bits from both sides.
   b. Stop, when the two writing pointers meet each other.
   c. Continue writing from both sides into the area provided for the less significant bits.
2. The audio frame is written in the 'normal' way, but shall be rearranged such, that the psychoacoustically less important bits are collected on one end of the bitstream:
   a. Start reading and parsing the frame from both sides.
   b. Stop, when the amount of bits provided for the more significant bits is read: The psychoacoustically less important bits are the remaining bits between the two reading pointers.
   c. Exchange the data up to the left pointer with the data between the two pointers.
3. The audio frame is written such, that the psychoacoustically less important bits are collected on one end of the bitstream, but shall be rearranged in the 'normal' way:
   a. Start reading the frame from both sides. If the psychoacoustically less important bits should be stored at the left side of the bitstream, the starting point for reading the psychoacoustically more important bits from the left side can be derived from (means: is equal to) the number of bits provided for the psychoacoustically less important bits. If the psychoacoustically less important bits should be stored at the right side of the bitstream, the starting point for reading the psychoacoustically more important bits from the right side can be derived from the number of bits provided for the psychoacoustically less important bits and the number of total bits.
  b. Stop, when the two writing pointers meet each other.
  c. Exchange the data up to the starting point for reading the psychoacoustically more important bits (see a.) with the data between this starting point and the meeting point of the two pointers.
4. The audio frame written such, that the psychoacoustically less important bits are collected on one end of the bitstream, shall be read:
  a. Start reading the frame from both sides. If the psychoacoustically less important bits should be stored at the left side of the bitstream, the starting point for reading the psychoacoustically more important bits from the left side can be derived from the number of bits provided for the psychoacoustically less important bits. If the psychoacoustically less important bits should be stored at the right side of the bitstream, the starting point for reading the psychoacoustically more important bits from the right side can be derived from the number of bits provided for the psychoacoustically less important bits and the number of total bits.
  b. Stop, when the two writing pointers meet each other.
  c. Continue reading from the remaining part of the frame both sides. The starting point for reading the psychoacoustically less important bits from the right side is the same as the starting point for reading the psychoacoustically more important bits from the left side (see a.).

Figure 5:
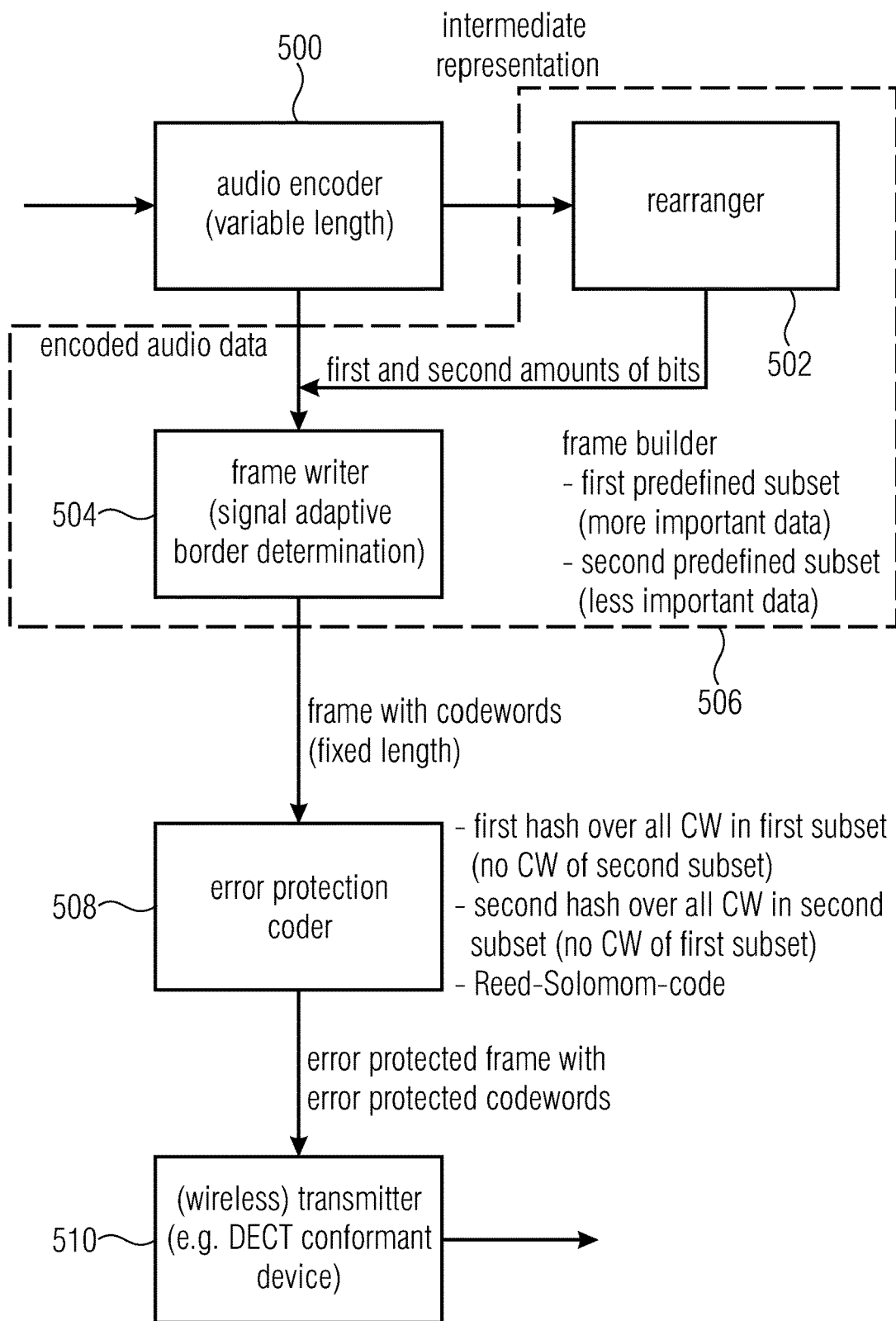
FIG. 5 illustrates an implementation of an audio transmitter processor.

FIG. 5 illustrates an audio transmitter processor in accordance with an embodiment of the present invention. The audio transmitter processor may comprise a frame builder 506 and an error protection coder 508.

The input into the audio transmitter processor is an amount of encoded audio data such as audio data derived from a frame of audio data input into an audio encoder 500 that, typically, is a variable length audio encoder. The bit amount used by the audio encoder depends on the signal to be encoded, but, in an implementation, the output of audio data—typically in the form of a frame of encoded audio data—is a fixed length frame. Therefore, the audio encoder typically encodes with variable quality so that a frame of audio data to be encoded that is difficult to encode is, in the end, represented in the encoded audio data by a lower quality representation while a frame of audio data to be encoded that is easy to encode, i.e., that can be encoded with a lower number of bits for a certain quality level is represented, in the end, at the output of the audio encoder 500 by a higher quality representation.

Typically, the output of the audio encoder for a certain, for example time domain portion of audio data comprises a first amount of information units and a second amount of information units. In case of a 50 percent overlap add situation, the time domain portion has twice the size of a frame, i.e., a number of audio samples newly input into the encoder or output by an overlap add stage of a decoder.

The frame builder 506 in FIG. 5 that may, for example, comprise a rearranger 502 and a subsequently connected frame writer 504 or that may, for example, consist of a frame writer only in case any intermediate representation is not an issue, is configured for building a frame having a codeword raster defining reference positions for a total number of predefined codewords for the frame. Such a frame is, for example, illustrated with respect to FIGS. 9a, 9b, 9c, where different codeword arrangements are given and where, for example, reference positions for the predefined codewords are indicated as vertical lines and those reference positions are a start of a codeword or an end of a codeword or both. These reference positions or raster points do not use any specific information units but are given by a certain bit or byte position, to which some data is written. Hence, the reference positions or raster points do not incur any overhead and typically mark the begin or end of a codeword for the error protection processor.

In accordance with the present invention, the frame builder is configured to write the information units of the first amount of information units starting at reference positions of a first predefined subset of the codewords.

The information units of the second amount of information units are written starting at reference positions of a second predefined subset of the codewords. Particularly, the frame builder 506 is configured to determine a border between the first amount of information units and the second amount of information units so that a starting information unit of the second amount of information units coincides with a codeword border. Thus, a clear separation between the first amount of information units and the second amount of information units and the correspondingly associated error protection procedures on the transmitter side on the one hand and the receiver side on the other hand is obtained.

The audio transmitter processor additionally comprises the error protection coder 508 for processing the predefined number of codewords individually to obtain a plurality of processed codewords representing the error protected frame. For this procedure, the error protection coder may comprise an entropy-adding or block encoder such as a Reed-Solomon encoder. Alternatively or additionally, the error protection coder may comprise another non-codeword individually processing device such as a CRC or Hash value processor that processes one or more of the codewords of the first predefined subset to obtain a first processing result such as a first Hash value or to process one or more of the codewords of the second predefined subset to obtain a second processing result such as a second Hash value and for adding the processing results or one of the first and the second processing results to the predefined number of codewords to obtain the plurality of processed codewords. The first processing result is only derived from the first predefined subset and the second processing result is only derived from the second predefined subset. Advantageously, the order of error protection processing is so that the first and the second processing results are calculated from the codewords that have not yet be subjected to any error redundancy processing such as the codewords at an input into the Reed-Solomon or any other error protection block encoder. It is of advantage that the first and the second processing results are added to the first and second predefined sets of codewords either in a separate additional codeword or to an empty space that is still available within either the first or the second set and the codewords and the processing results such as the Hash values are protected by means of the Reed-Solomon encoder processor.

The error protected frame obtained by the error protection coder 508 of FIG. 5 is forwarded to a wireless transmitter such as a DECT (digital enhanced cordless telephone) standard conformant device. This transmitter 510, therefore, sends the error protected frame out into the (wireless) error-prone channel.

Advantageously, the frame builder 506 is configured to determine the border between the first amount of information units and the second amount of information units based on an information capacity of the second predefined subset so that the information capacity of the second predefined subset is equal to the amount of information units of the second amount of information units. As soon as the frame writer 504 has written an amount of data equal to the whole amount of data for the whole frame less the capacity of the second predefined subset, the first amount of data of the audio frame is complete and the second amount of data starts at the start of the first codeword of the second predefined subset of the codewords.

The audio encoder 500 or source encoder for generating the first and second amounts of information units relies on a frame-wise processing and using a predefined time portion of an audio signal. The information units comprise a set of obligatory information units such as the data generated by an arithmetic encoder or, generally, variable length encoder. The information units have a variable number of residual information units that provide an improved quality representation of the time portion of the audio signal and this data is written into the bitstream, when the bit budget is not yet completed by the arithmetic encoder. The source encoder 500 is configured for using a variable length coding rule resulting in the signal-dependent number of information units for the predefined time portion. The frame builder is configured to build the encoded audio frame so that the encoded audio frame has a fixed size in encoded information units, and the audio encoder 500 is configured to determine the variable number of the residual information units as a difference between the predefined frame size and the number of obligatory bits.

Advantageously, the frame builder 504 is configured to determine the border between the first amount of information units and the second amount of information units signal-adaptively from frame to frame, so that, depending on the audio signal for a frame, the border represents a border information unit related to a different audio information of the frame or being interpreted differently by an audio decoder. Advantageously, the border information unit refers and represents a certain spectral value or a certain combination of spectral values in a spectral domain audio coder as may be used within the audio encoder 500 and which will later be discussed with respect to FIG. 21 for the encoder and FIG. 22 for the decoder.

Figure 6:
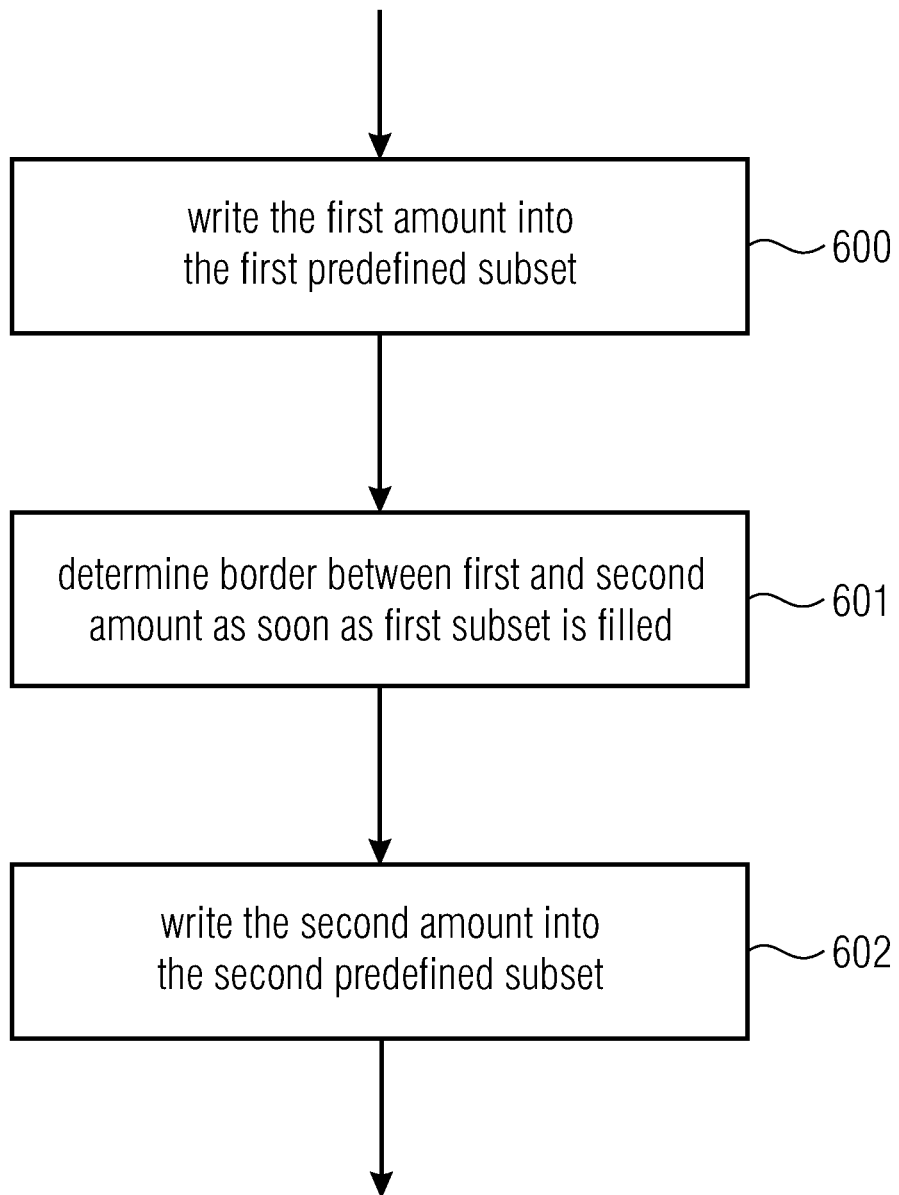
FIG. 6 illustrates a procedure for implementing the frame building.

In an implementation of the present invention, the frame writer 504 or, generally, the frame builder 506 is configured to write the first amount of information units into the first predefined subset identified at 600 in FIG. 6. In step 601, the border between the first and the second amount of information units is determined and as soon as the first subset is filled with information units. As indicated in item 602, the second amount of information units is written into the second predefined subset of the codewords.

Figure 7:
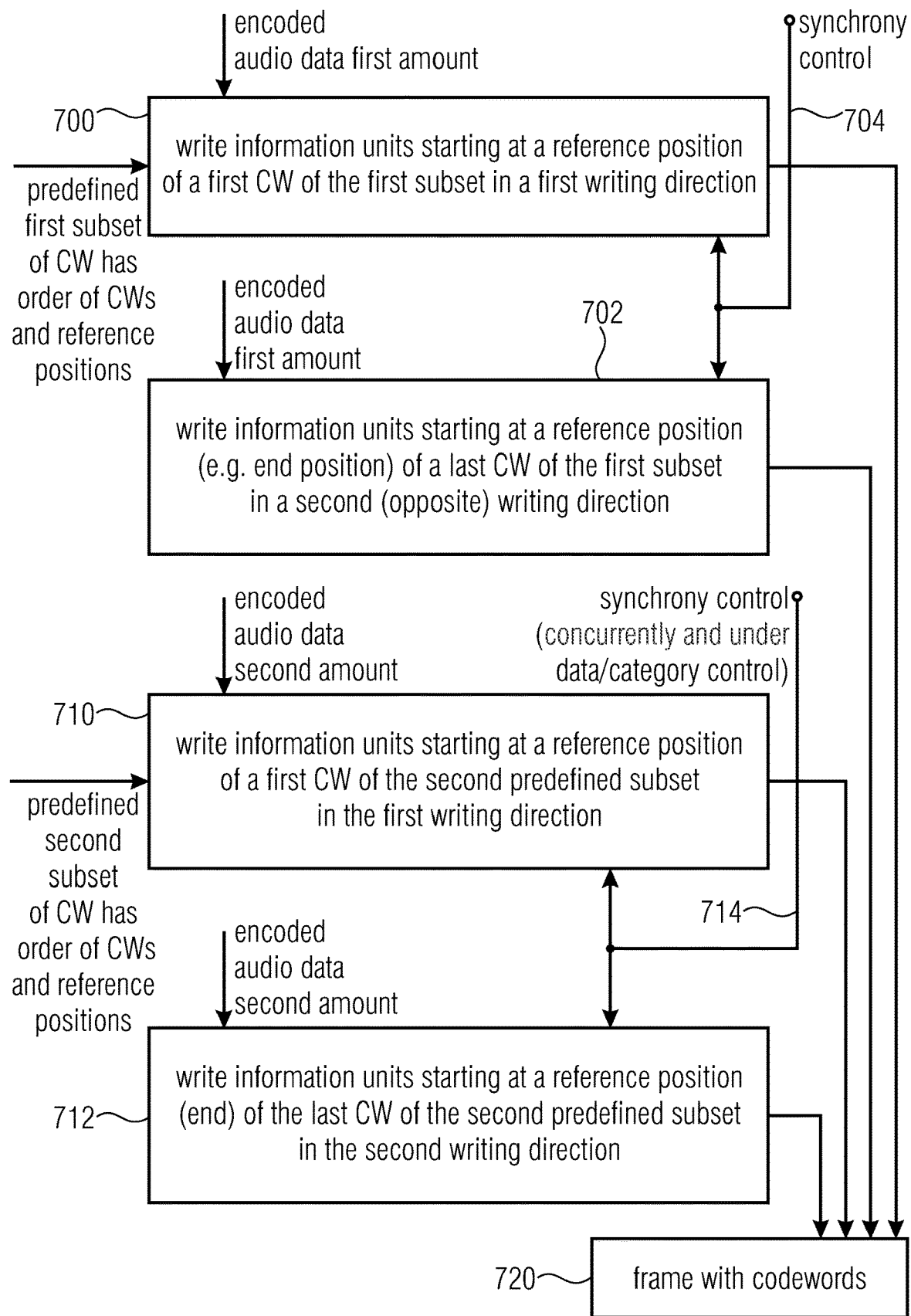
FIG. 7 illustrates a procedure performed by the frame builder of FIG. 5.

Advantageously, as illustrated in FIG. 7, the first predefined subset of the codewords has an order of codewords and specified reference positions. The same is true for the second predefined subset of the codewords that also may have an order of codewords and reference positions.

Figure 9A:
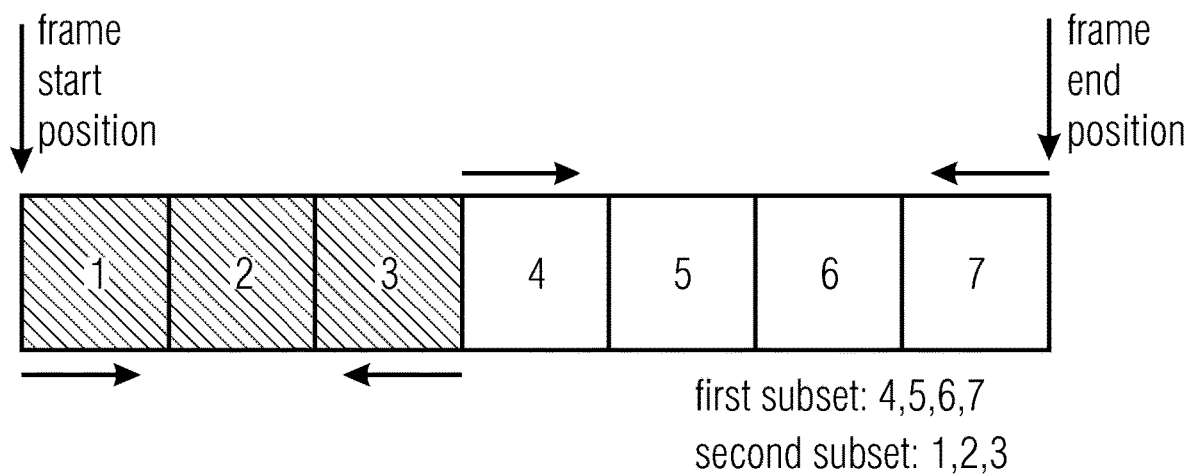
FIGS. 9a-9c illustrate schematic representations of locations of the first predefined subset of the codewords and the second predefined subset of the codewords within a frame built by the frame builder of FIG. 5.

FIG. 9a illustrates a first possibility of arranging a predefined subset of the codewords within a frame of codewords. In the FIG. 9a embodiment, the first subset of the codewords are codewords 4, 5, 6, 7 and the second subset of the codewords are codewords 1, 2, 3.

The codewords of the second subset of the codewords—that receive the second amount of information units that are, advantageously, the psychoacoustically less important audio data—are all positioned adjacent to each other and at the frame start position. The codewords of the first subset of the codewords—that receive the first amount of information units that are, advantageously, the psychoacoustically more important audio data—are all positioned adjacent to each other and at the frame end position.

The first predefined subset of the codewords is predefined by the fourth codeword in the frame and by an order or sequence of codewords from codeword 4 to codeword 5, from codeword 5 to codeword 6, and from codeword 6 to codeword 7. The first predefined subset identifies the codewords and the order of the codewords for the writing direction. The frame builder is configured to write, in the embodiment, the first subset of the codewords, i.e., the codewords 4, 5, 6, 7 as indicated by the arrows that start at reference positions of the codewords. The writing operation from left to right starts at the start of the fourth codeword as the reference position and the writing in the opposite direction starts at the end of the seventh codeword as the reference position, i.e., at the frame end position. The second predefined subset also identifies the codewords and the order of the codewords for the writing direction correspondingly.

The second subset of the codewords is predefined by the first codeword in the frame and by an order or sequence from the first codeword to the second codeword and from the second codeword to the third codeword. In case the codewords or a subset are all adjacent to each other, the order or sequence information is implicitly given by the writing or reading direction. Again, the writing in the left direction from left to right is at the frame start position of the first codeword and the writing from the right end of the second subset, i.e., from the codeword 3 starts from the end of the third codeword in the direction to the frame start position.

Naturally, the number of codewords in the first subset and in the second subset is freely selectable and, the higher the number of the codewords of the second subset is, the lower is the necessity for a full frame loss concealment. However, it has to be made sure that the number of codewords of the first subset is large enough so that a partial frame loss concealment with an acceptable quality can be done when all the codewords of the second subset or, for example, the codewords 1 and 3 in the FIG. 9a embodiment of the second subset are erroneous as can be detected by the audio receiver processor illustrated in FIG. 13.

Figure 9B:
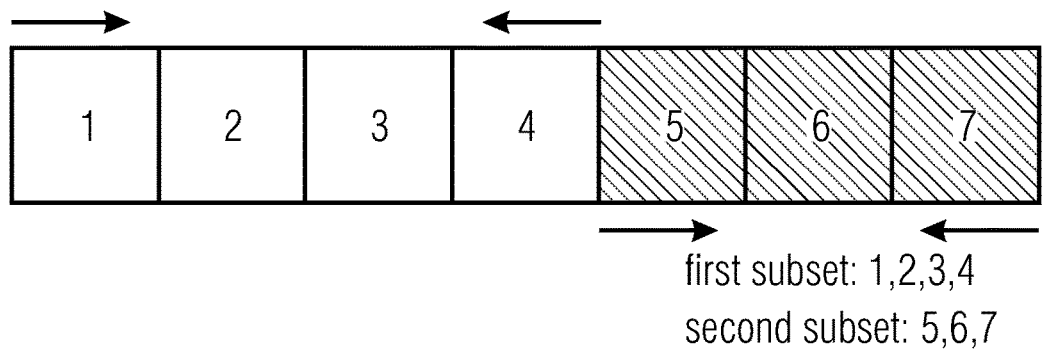

FIG. 9b illustrates an alternative implementation of the first predefined subset and the second predefined subset. Once again, both subsets define codewords that are adjacent to each other, but the first predefined subset is now aligned with the frame start position and the second predefined subset of the codewords is now aligned with the frame end position.

Figure 9C:
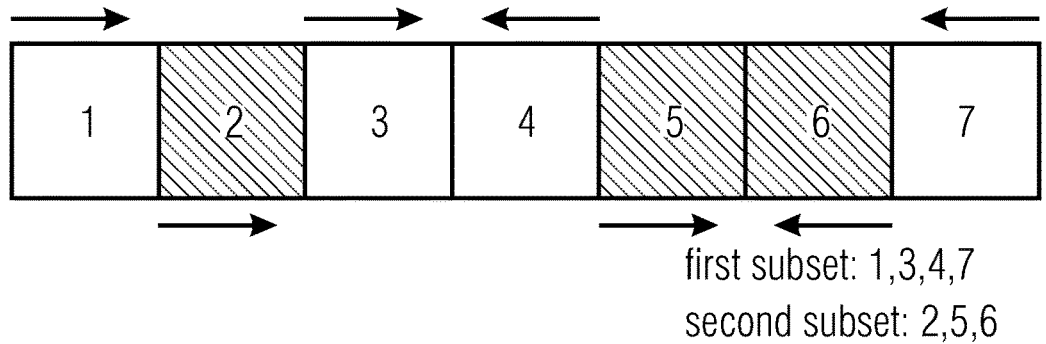

FIG. 9c illustrates another alternative, where the first subset and the second subset are arranged non-adjacent to each other, i.e., a codeword of the second subset, i.e., codeword 2 is interspersed between two codewords, i.e., codeword 1 and codeword 3 of the first predefined subset. FIG. 9c once again indicates the writing direction for the individual codewords, and it becomes clear that, for example, codeword number 5 is written from both sides, and when this is the case, the writing pointers for writing the second subset of the codewords will meet each other at some place within codeword number 5.

In the FIGS. 9a to 9c embodiments, the arrows above the codeword representation indicate the direction of writing when the implementation of two writing pointers is applied that is subsequently discussed with respect to FIG. 8. Particularly, as discussed with respect to FIGS. 9a to 9c, the frame builder 5 is configured to use, as the second subset of the codewords a predefined number of adjacent codewords at one side of the frame of the encoded audio data as, for example, illustrated in FIG. 9a, or to use, as the first subset of the codewords, a first predefined number of adjacent codewords at another side of the frame of the encoded audio data as, for example, illustrated with respect to FIG. 9a or 9b, where a sum of the first predefined number of codewords and the second predefined number of codewords is equal to the total predefined number of codewords. Alternatively, as illustrated in FIG. 9c, at least one codeword of the first subset is located between two codewords of the second subset or vice versa.

Advantageously, the frame builder 506 is configured to write the first amount of information units into the first predefined subset using a reference position of the first subset of the codewords and, as soon as the first predefined subset is filled, the second amount of information units is written at reference positions of the second predefined subset, and the frame builder 506 is configured to determine the border as the last information unit written into the last codeword of the first predefined subset or as the first information unit written at a reference position of a first codeword of the second predefined subset. Advantageously, the first and the second amounts of information units are selected in such a way that all or at least a majority of the information units of the first amount of information units is psychoacoustically more important than a majority or all the information units of the second amount of information units.

Alternatively or additionally, and as discussed with respect to the transmitter side, only partial frame loss concealment is envisioned in an audio receiver processor when only information units in the second amount of information units are detected as corrupted and wherein a full frame loss concealment is envisioned in the audio receiver processor, when information units in the first amount of information units are determined as corrupted.

As is discussed later on with respect to FIG. 1 or 2, the encoded information units are from at least two categories that are selected from a group of categories consisting of fixed length side information, variable length side information, temporal noise shaping information, one or more most significant bits of a first frequency portion of a spectrum, one or more most significant bits of a second frequency portion of the spectrum, wherein the second frequency portion is higher than the first frequency portion, one or more least significant bits or sign bits of the first frequency portion, one or more least significant bits or sign bits of the second frequency portion and residual bits, wherein, if generated by the audio encoder, the fixed length side information, the variable length side information, the temporal noise shaping information, the one or more most significant bits of the spectrum of a first frequency portion and the one or more least significant bits or sign bits of the first frequency portion are used as categories for the first amount of information units, and wherein the most significant bits of the second frequency portion, the one or more least significant bits or sign information units of the second frequency portion or the residual bits are used as categories for the second amount of information units.

Figure 8:
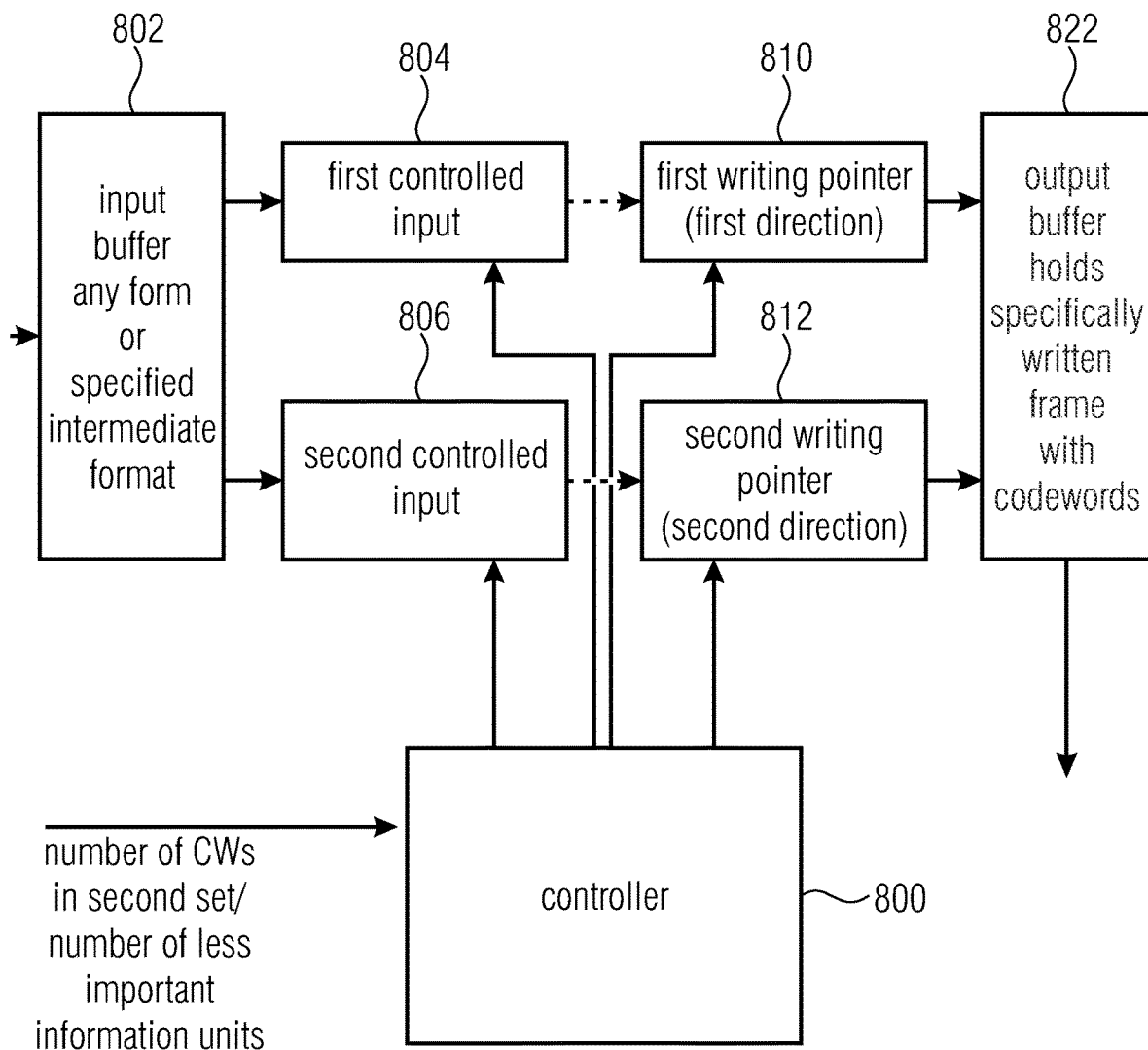
FIG. 8 illustrates the procedure of the frame builder.

In an embodiment illustrated in FIG. 8, two writing pointers 810, 812 are used. The first writing pointer 810 is configured to operate and write in a first writing direction, and the second writing pointer 812 is configured to operate and write in a second writing direction, which is opposite to the first writing direction. The data for the first writing pointer is obtained by a first controlled input and is taken, for example, from an input buffer 802 in which any imaginable form of audio encoder output data is or in which a specified intermediate format such as a standardized format, as for example, discussed with respect to FIG. 1 for the LC3 (Low Complexity Communication Codec) audio encoder is present.

In a first example case, the data in the input buffer comes directly from an encoder. In this case, the data are taken as they come from the encoder. In an example of this first example case, the encoder writes LSBs and Signs for a spectral line or a spectral line tuple in the first controlled input 804 and MSBs for this same spectral line or spectral line tuple in the second controlled input 806.

In a second example case, the data stem from an already written frame. Then, the controller applies a bitstream or frame parser reading the bitstream or frame and providing the data to the controlled inputs in the read/parsed order. In an example of this second example case, the parser reads LSBs and Signs for a spectral line or a spectral line tuple and provides this data into the first controlled input 804 and the parser reads MSBs for this same spectral line or spectral line tuple and provides this data into the second controlled input 806.

There is a second controlled input 806 that also accesses the input buffer 802 and that provides data to the second writing pointer 812 that is configured to write in the second (opposite) direction. The controller 800 is configured to control at least the first and second writing pointers 810, 812 and advantageously additionally the inputs 804, 806. The controller receives, as an input, the number of codewords of the second set or, correspondingly, the number of less important information units, i.e., the capacity of the codewords of the second predefined subset of the codewords. The controller advantageously has stored information about the predefined first and second subsets and the associated orders, i.e. information on the codeword numbers/positions in the frame and/or the order of the codewords for a respective subset.

The controller 800 controls the inputs 804, 806. The controller additionally sets the first and second pointers to the start positions/addresses in a frame for the first amount of information units. The pointer 810 is incremented and the pointer 812 is synchronously decremented.

The controller 800 detects that all codewords of the first subset are written into the output buffer and the controller sets the first and second pointers' start positions/addresses for the second amount of information units and, subsequently synchronously increments/decrements the writing pointers in order to additionally performing writing of the second amount of information units. Advantageously, the order of the procedures done by the controller 800 is as indicated in FIG. 8 but different orders can be performed as well. However, determining the start of the second amount of information units based on when the first amount of information units is written is an automatic and low efficiency and low complicated way of determining the first and second amount of information units from frame to frame even though the audio encoder is operating in an audio signal dependent way.

Figure 10:
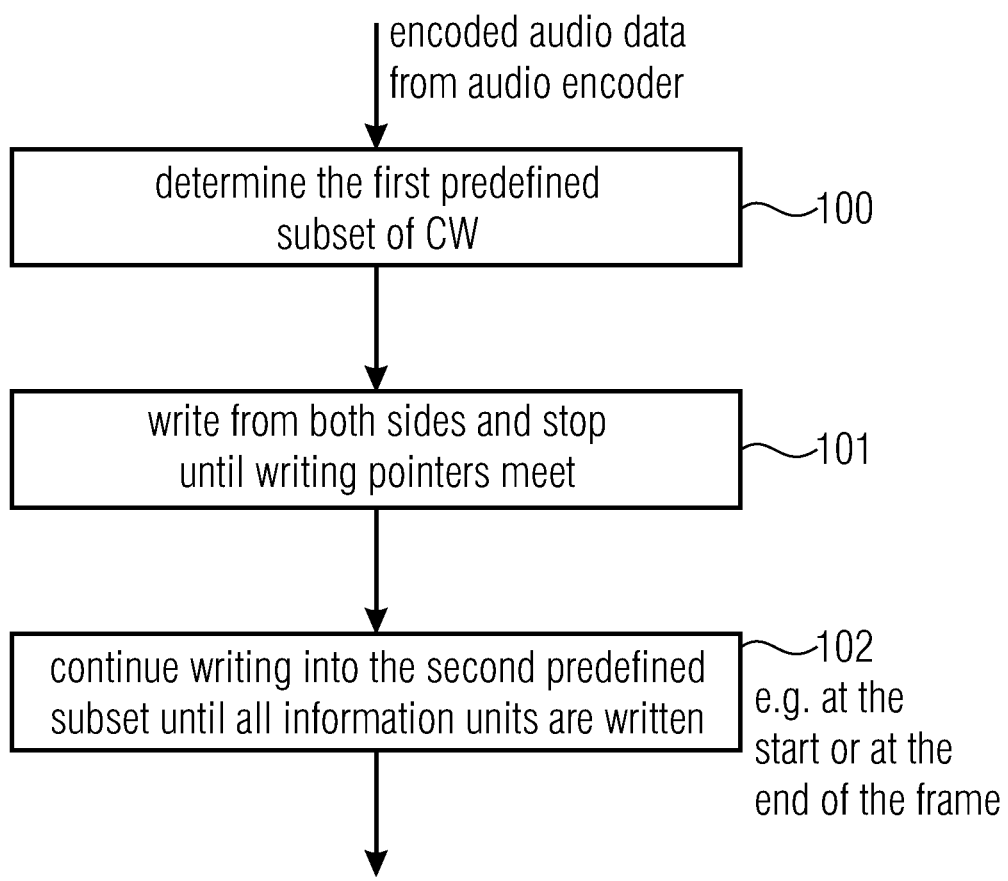
FIG. 10 illustrates an implementation of a direct writing of the frame by the frame builder.
Figure 11:
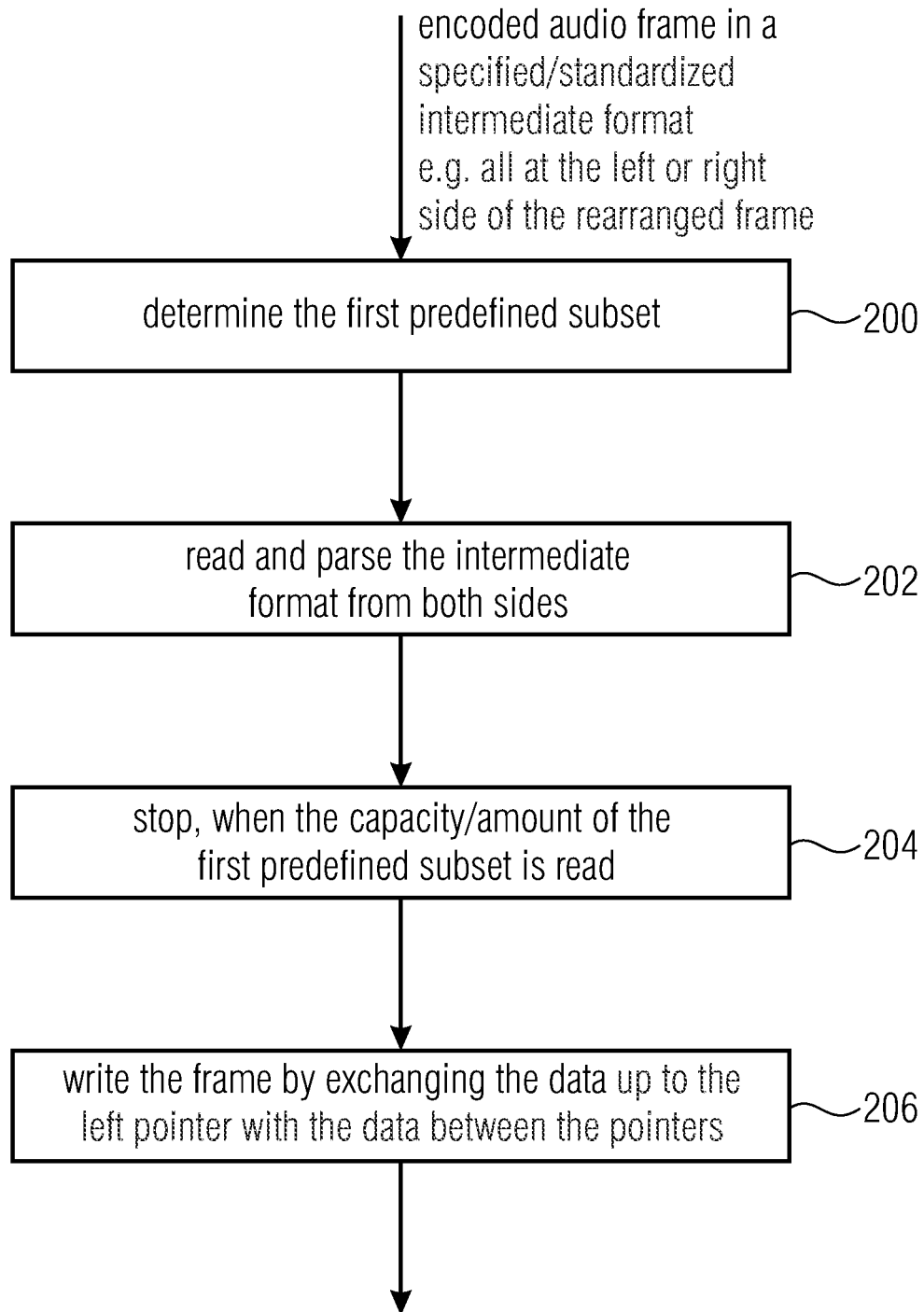
FIG. 11 illustrates an implementation of the rearrangement procedure of the frame builder of FIG. 5.

There exist several applications for the frame builder as is discussed with respect to FIGS. 10 and 11. Particularly, FIG. 10 illustrates the procedure, when a direct writing is performed. In step 100, the frame builder receives the encoded audio data from the audio encoder and determines the first predefined subset of the codewords. It is written from both sides and the writing is stopped when the writing pointers meet each other as indicated at item 101. Writing is continued into the second predefined subset of the codewords until all information units are written. Particularly, as indicated at 102, the writing is continued at the start or the end of the frame for the second predefined subset at least with respect to one writing pointer.

The frame builder can also be used for rearranging an already existing bitstream such as an LC3 bitstream format. In this procedure, an encoded audio frame exists in a specified/standardized intermediate format where, for example, all codewords for the first set or all codewords of the second set are located adjacent to each other at the left or the right side of the finally to be rearranged frame.

In step 200, the first predefined subset is determined. In step 202 the intermediate format is read and parsed from both sides. In step 204 reading and parsing is stopped, when the capacity of information units in the first predefine subset is read. In step 206, the frame is written by exchanging the data up to the left pointer with the data between the pointers in the specific embodiment that is, for example, illustrated in FIG. 3 to be discussed in detail later. A writing operation in the FIG. 11 embodiment is only done in step 206, since steps 202 to 204 only refer to reading and parsing and doing other procedures. The writing does not necessarily have to be an incremented or decremented writing as in the direct writing discussed with respect to FIG. 10, but the writing is done by exchanging certain contiguous amounts of information units.

Figure 12:
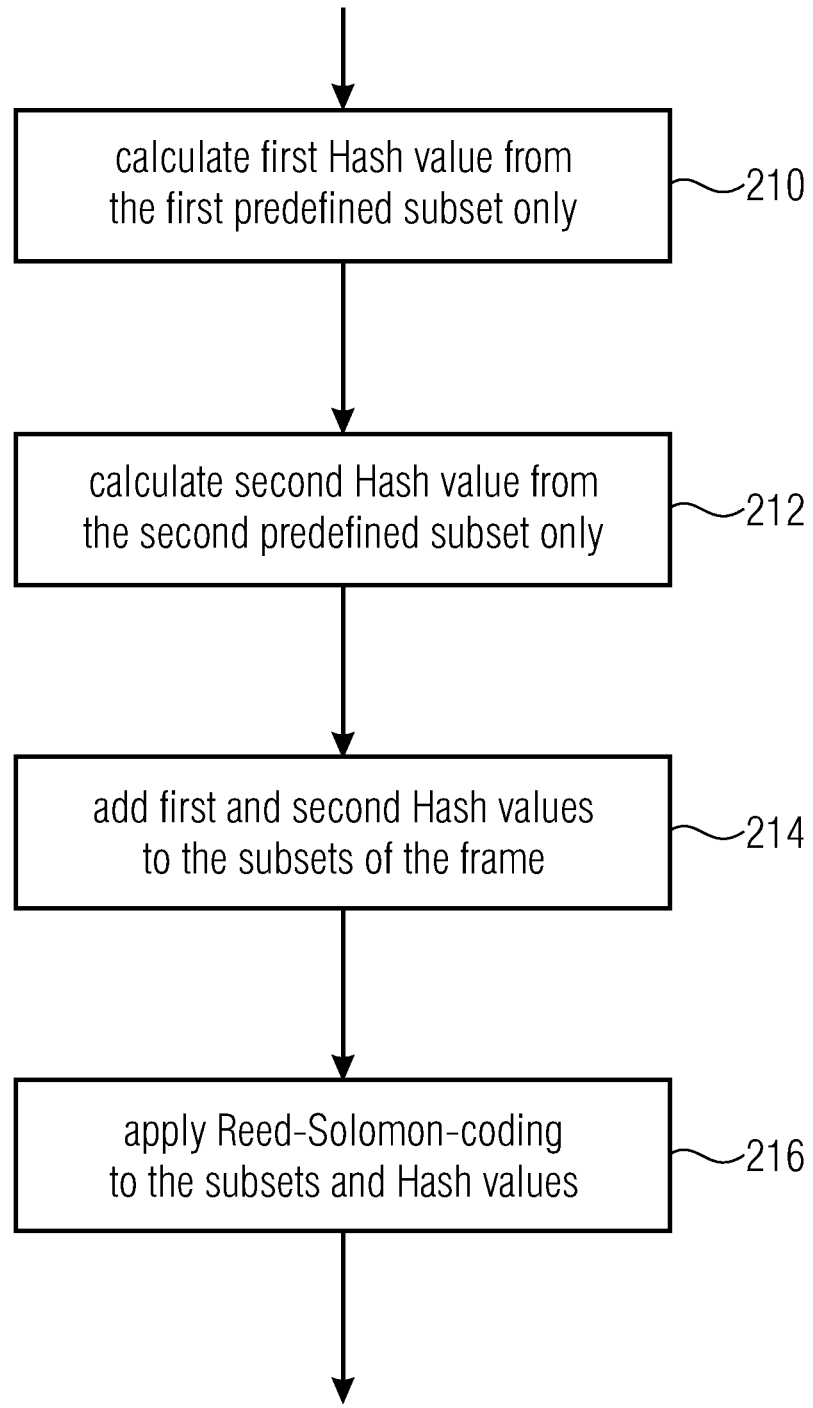
FIG. 12 illustrates an implementation of the error protection coder of FIG. 5.

FIG. 12 illustrates an implementation of the error protection coder 508 illustrated in FIG. 5. In a first step 210, the error protection processor 508 calculates a first Hash value from the first predefined subset of the codewords only, without any codeword from the second subset of the codewords. In step 212, a second Hash value is calculated from the second predefine subset only, i.e., without any codeword from the first predefined subset.

In step 214, the first and the second Hash values are added to the subsets of the frame as indicated at 214. In step 216, a block coding such as a Reed-Solomon-coding is performed to the subsets and the Hash values in order to obtain the error protected frame that is forwarded to the advantageously wireless transmitter 510 that is, for example, a DECT conformant transmitter.

Figure 21:
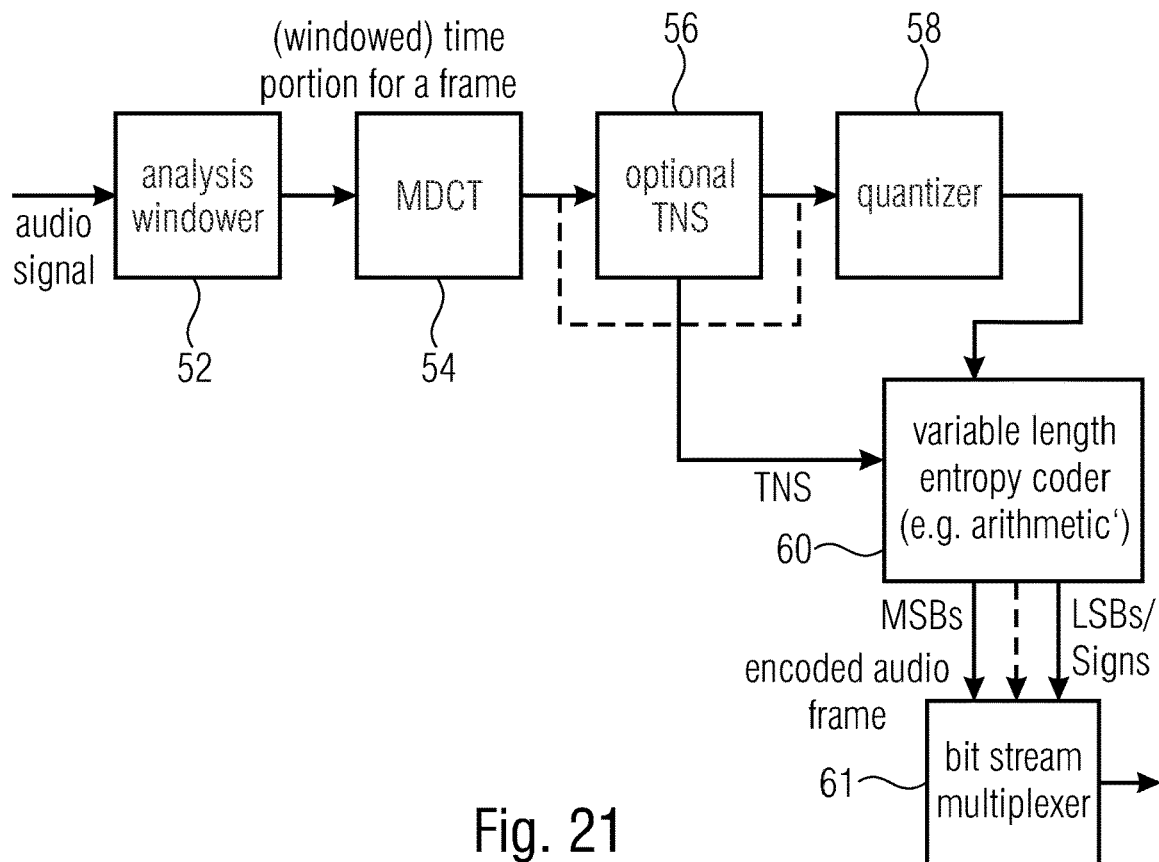
FIG. 21 illustrates an implementation of an audio encoder of FIG. 5.

FIG. 21 illustrates a typical audio encoder or source encoder such as the audio encoder 500, but the audio encoder 500 can also be implemented by any other audio encoder that operates in a variable-length way, i.e., generates a certain amount of bits for a time portion of an audio signal that varies from frame to frame when the quality is kept the same.

An audio signal is input into an analysis windower 52 that, advantageously, operates in an overlap way, i.e., has a time advance value that is lower than the time length of the window. This data is a (windowed) time portion for a frame and is input into a time-frequency transform 54 that may be implemented as an MDCT (modified discrete cosine transform).

In block 56, an optional temporal noise shaping operation is performed which consists of a prediction over frequency. The output of the TNS stage 56 are prediction residual values and, additionally, TNS side information is output advantageously into the entropy coder 60 that is a variable length entropy coder such as an arithmetic coder. The MDCT output spectral values or the TNS spectral residual values are quantized by a quantizer 58 that may or may not be controlled in a psychoacoustic way and the quantized data is input to the variable length entropy coder such as an arithmetic coder. The audio encoder additionally comprises a residual coder for generating residual bits that are used in order to fill the frame with additional bits, when the variable length entropy coder does not fully consume the available bit budget. Other features that can be used or not are noise filling, global gain application or spectral noise shaping. At the output of the block 60, a bit stream multiplexer is arranged receiving data from block 60 that can be MSBs, LSBs and Signs and other data.

Figure 22:
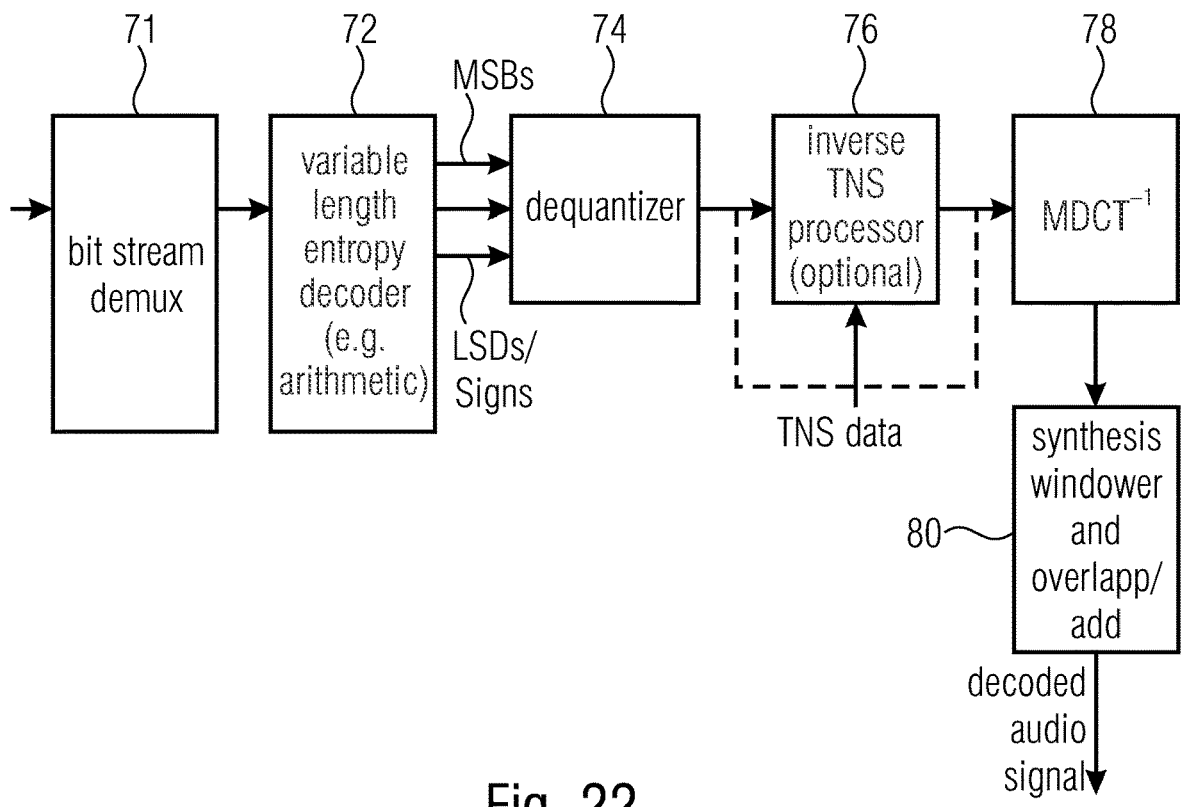
FIG. 22 illustrates an implementation of an audio decoder of FIG. 13.

On the decoder-side illustrated in FIG. 22, a variable length entropy decoder is there, which is, once again, an arithmetic decoder, for example. The result of the variable length entropy decoder is input into a dequantizer 74 and the output of the dequantizer 74 is processed by an inverse TNS processor when TNS processing is available or, when TNS is not performed, the output of the dequantizer 74 is forwarded to the inverse frequency-time transform that can, for example, be an inverse MDCT transform as indicated at 78 in FIG. 22. The output of block 78 is forwarded to the synthesis windower and overlap/add processor 80 that, finally, obtains a time domain decoded audio signal. The TNS data used by the inverse TNS processor 74 is typically derived from the bitstream and is even advantageously derived from the variable length entropy decoder, but other ways in order to encode and process and transmit data can be used as well.

Subsequently, an implementation of the present invention is discussed with respect to FIGS. 1 to 4. This embodiment relies on the order and arrangement of the first and second predefined subsets of codewords illustrated in FIG. 9a, but is equally applicable to other arrangements as well. The subsequent embodiment gives a clear detail up to a bit level but, of course, the specific figures are embodiments only and it is clear that other detailed figures/numbers can be used as well.

The focus within this section is exemplarily on the rearrangement scenario to align the data to a given error protection and detection scheme, allowing for individual frame loss concealment procedures depending on the availability of the psychoacoustically more important data and the psychoacoustically less important data.

The embodiment is explained based on the LC3 bitstream payload. This bitstream payload can roughly be subdivided into the following categories (see before):
1. Side information, fix part (solid red) and variable part (red-white striped diagonally)
2. TNS, arithmetically encoded ($TNS_{arith}$)
3. MSBs of the spectrum, arithmetically encoded (MSB $Spec_{arith}$)
4. LSBs and Signs of the spectrum (LSB-Sign Spec)
5. Residual Note that the spectrum is encoded by means of spectral tuples, whereas each tuple represents two subsequent spectral lines.

The arrows indicate the writing and reading direction. The writing/reading order is as follows:
1. The fix part of the side information is written from right to left.
2. The variable part of the side information is written from right to left.
3. The arithmetically coded TNS data is written from left to right.
4. The arithmetically coded MSBs of the spectrum as well as the LSBs and the Signs of the spectrum are written synchronously (spectral line by spectral line, starting with the spectral line representing the lowest frequency), whereas the arithmetically coded MSBs are written from left to right and the LSBs and Signs (being not arithmetically coded) are written from right to left).

5. If there are still bits left between those two data parts, Residual bits are written from right to left.

While categories 1 and 2 are always treated as psychoacoustically important, categories 3 to 5 are generally treated as less psychoacoustically important. However, the relevancy is not constant for all those bits within this region:
Bits representing the residual are least significant;
Bits representing spectral tuples are the psychoacoustically less important, the higher the frequencies the covered spectral lines represent, i.e.
Bits representing spectral tuples covering spectral lines with a higher frequency are less significant;
Bits representing spectral tuples covering spectral lines with a lower frequency are more significant.

Figure 2:
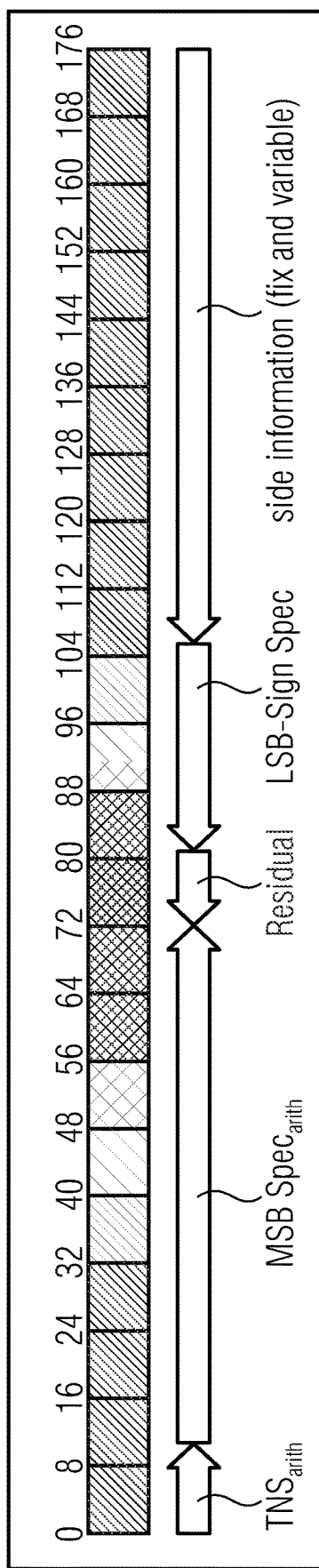
FIG. 2 illustrates a distribution of bits of the example LC3 bitstream payload given in FIG. 1 based on their psychoacoustic relevancy.

FIG. 1 and FIG. 2 show the distribution of bits based on their psychoacoustic relevancy. Red indicates a high relevancy; green indicates a small relevancy. There are two transition phases, and both of them change dynamically on a frame-by-frame basis.

The last written bits in the bitstream are the psychoacoustically least important bits. Their location is variable. It can be determined directly while writing or reading (and parsing) the bitstream by checking until the given number of bits to be treated as psychoacoustically less important is left. This given number covers the residual and the bits of a certain number of spectral lines (MSBs as well as LSBs and Signs). The coverage of the spectrum starts with the lines representing the highest frequencies. The higher the given number of less important bits, the lower is the upper frequency, which can successfully be decoded if those less important bits are distorted.

The number of codewords to be treated as psychoacoustically less important $N_{pccw}$, and the amount of bits being treated as psychoacoustically less important, is a tuning parameter. This tuning parameter is determined advantageously from a characteristic of the error protection code. For one embodiment in LC3, the optimal size has been derived experimentally depending on the protection strength (error protection mode m) and the slot size $N_s$ as examples for a characteristic of the error protection code, which specifies the size of the channel encoded frame, i.e. the gross frame size, in bytes. This is embodied in the following formula:

$$M_{pccw} = \begin{cases} \lfloor 0.080447761194030 \cdot N_s - 1.791044776119394 + 0.5 \rfloor, & \text{for } m = 3 \text{ and } N_s \geq 80 \\ \lfloor 0.066492537313433 \cdot N_s - 1.970149253731338 + 0.5 \rfloor, & \text{for } m = 4 \text{ and } N_s \geq 80 \\ 0, & \text{otherwise} \end{cases}$$

Figure 3:
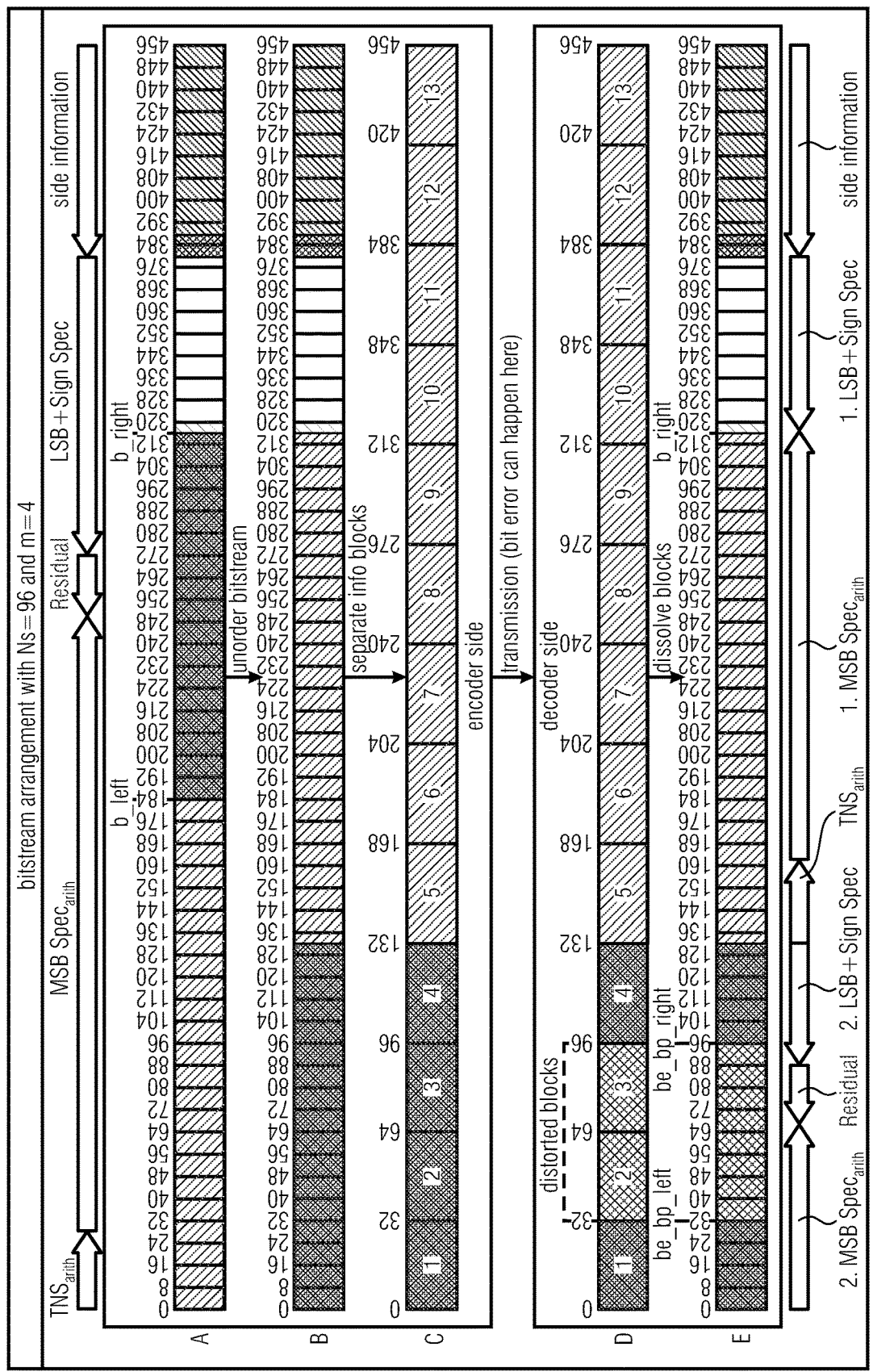
FIG. 3 illustrates an example of an LC3 bitstream payload rearrangement.

FIG. 3 gives an example of an audio frame before and after the rearrangement as well as the assignment to the codewords provided by the channel codec. It also shows the parsing of the rearranged bitstream payload on decoder side.

The gross bitrate in this example is 76800 bits/s at 10 ms framing, resulting in 96 bytes per frame. For this frame length, the channel codec provides 13 codewords: 3 codewords with a gross size of 7 bytes and 10 codewords with a gross size of 7.5 bytes. With error protection mode 4 (=3 bytes protection overhead), the fec (forward error correction) overhead is 39 bytes, leaving 57 bytes for the payload, split over 3 codewords with a net size of 4 bytes and 10 codewords with a net size of 4.5 bytes.

FIG. 3A shows the bitstream payload of one frame separated into 57 byte packets, resulting in 456 total bits [0:455]. The red block corresponds to the static side information, whereas the red/white shaped region corresponds to the dynamic side information, which may vary from frame to frame depending on the coded data.

The bits treated as less significant are shown in blue, delimited by the bit borders b_left and b_right (in the given example, b_left=184, b_right=315). This area overlaps the residual bits and additionally covers bits from the "MSB Spec$_{arith}$" and from the "LSB+Sign Spec", starting from the highest frequencies. The number of bits from the "MSB Spec$_{arith}$" is usually higher than the number of bits from the "LSB+Sign Spec", since usually more bits per spectral line are consumed to encode the MSBs than to encode the LSBs and Sign.

"MSB Spec$_{arith}$" up to b_left (written from left to right, shown in green) and "LSB+Sign Spec" up to b_right (written from right to left, shown in white) jointly represent the spectral tuples from zero Hertz up to the highest frequency encoded up to this point. If one more spectral tuple should be considered as psychoacoustically less important, at least one border would move outwards; if one more spectral tuple should be considered as psychoacoustically more important, at least one border would move inwards.

FIG. 3B shows the frame after the rearrangement: The blue part [184:315] is exchanged with the green part [0:183]. Note, that the blue part may be smaller, of equal size, or larger than the green part.

FIG. 3C displays the payload of the 13 codewords as input into the channel codec.

FIG. 3D shows the received bitstream payload. It exemplarily shows two distorted codewords.

FIG. 3E shows the decoding process. It exemplarily shows the distorted bits encapsulated between the two bit borders be_bp_left and be_bp_right. Frequency bins of spectral tuples represented by the bits within this range should be synthesized by the partial frame loss concealment.

Obviously, the assignment of the bits within the bitstream payload to the two envisioned classes does not directly map to the codewords provided by the channel coder.

In the given example, the part between b_left and b_right in FIG. 3A [184:315] is assigned to the second class, whereas the other bits [0:183] and [316:455] are assigned to the first class. Here, the bits assigned to the second class [184:315] in FIG. 3A do not fit into the codeword structure in FIG. 3C without increasing the number of codewords for the second class. The second class would lie partially in the codeword 6 [184:203], fully in the codewords 7 to 9 [204:311] and partially in the codeword 10 [312:315]. Hence, a rearrangement is used as shown in FIG. 3B: Now the second class [0:131] fits perfectly into the first four codewords 1 to 4.

In the given example, 4 codewords belong to the second class and 9 codewords belong to the first class. The number of bits to be stored in either class is such limited by the amount of payload bits offered by the codewords of this class. In the given example, codewords 1 to 3 provide each a payload of 4 bytes, whereas codewords 4 to 13 provide each a payload of 4.5 bytes. This results in 3*4 bytes+1*4.5 byte=16.5 byte for the psychoacoustically less important bits and 9*4.5 bytes=40.5 byte for the psychoacoustically more important bits.

While the number of psychoacoustically less important bits (block_size) is predetermined, the location of the borders (b_left and b_right) varies on a frame-by-frame basis. After the rearrangement, those bits are always located at the same spot, which enables an efficient channel coding.

At encoder side, the bitstream bs_enc is rearranged as follows:

bs_rearranged(k) =
$$\begin{cases} \text{bs\_enc(b\_left} + k), & 0 \le k < \text{block\_size} \\ \text{bs\_enc}(k - \text{block\_size}), & \text{block\_size} \le k < \text{b\_left} + \text{block\_size} \\ \text{bs\_enc}(k), & \text{b\_left} + \text{block\_size} \le k < \text{len} \end{cases}$$

Where len is the net size of the frame in bits and block_size is the number of less significant bits.

On decoder side, the border b_right, which is the border where the two pointers reading "1. MSB Spec$_a$n$_t$h" and "1. LSB+Sign Spec" meet each other (see FIG. 3E), is determined while decoding the bitstream. The number of psychoacoustically less important bits is known from the forward error protection configuration (error protection mode and number of codewords $N_{pccw}$). The rearrangement of the frame bs_rearranged at decoder side is done as follows:

bs_dec(k) =
$$\begin{cases} \text{bs\_rearranged(block\_size} + k), & 0 \le k < \text{b\_left} \\ \text{bs\_rearranged}(k - \text{b\_left}), & \text{b\_left} \le k < \text{b\_lefgt} + \text{block\_size} \\ \text{bs\_rearranged}(k), & \text{b\_left} + \text{block\_size} \le k - \text{len} \end{cases}$$

If no bit-errors are applied on the bs_rearranged frame, bs_enc is equal to bs_dec.

As indicated before, the rearrangement can be done either as a post-processing step, or directly during the writing/reading process.

The following parameters are static:
1. The slot size $N_s$ specifies the size of the channel encoded frame in octets (bytes). In the given example $N_s$=96.
2. $N_{cw}$ specifies the number of codewords that are used to encode the data frame $$N_{cw} = \left\lceil \frac{2N_s}{15} \right\rceil$$

In the given example $N_{cw}$=13.

3. The parameter $L_i$, which is defined for i=0 . . . $N_{SW}$−1, specifies the length of the $i^{th}$ codeword in semi-octets (i.e. nibbles) and is given by:

$$L_{13-i} = \left\lfloor \frac{2N_s - i - 1}{N_{cw}} \right\rfloor + 1$$

$$L_{13-i} = \left\lfloor \frac{2N_s - i - 1}{N_{cw}} \right\rfloor + 1$$

$L_1 ..._3$=14, $L_4 ..._{13}$=15 ln the given example. Note that the enumeration is done differently in FIG. 3C.

$L_1 ..._3$=14, $L_4 ..._{13}$=15

4. The parameter $d_{i,m}$, which specifies the Hamming distance of (RS)-code i in error protection mode m, is given by:

$d_{i,m}$:=2m−1 for i=0 . . . $N_{cw}$−1

$d_{i,m}$:=2m−1 for i=0 . . . $N_{cw}$−1 m>1$d_{i,m}$=2*4−1=7 where. In the given example m>1$d_{i,m}$=2*4−1=7

5. The number of codewords assigned for the psychoacoustically less important bits is derived based on the frame length and the error protection mode (see above). In the given example $N_{pccw}$=[4.913134]=4

6. The size of the partial concealment block in semi-octets can be derived as $$N_{pc} = \sum_{i=N_{cw}-N_{pccw}}^{N_{cw}-1} L_i - d_{i,m} + 1$$

$N_{pc}$=33 ln the given example.

$N_{pc}$=33

7. The number of less important bits (block_size) can be derived as:

block_size=4$N_{pc}$ block_size=4$N_{pc}$ block_size=132 1n the given example.

block_size=132

8. Accordingly, the starting point for writing the TNS data is known (16.5 bytes from the left).

The following needs to be done for each frame on encoder side:
1. Write fixed part of the side information, starting from the right end of the bitstream payload, from right to left.
2. Write variable part of the side information, starting at the left end of the fixed part of the side information, from right to left
3. Write TNS data, starting block_size from the left end of the bitstream payload, from left to right.
4. Write MSBs "1. MSB Spec$_{arith}$" of the spectral data, starting from the right end of the TNS data, from left to right, up to b_left+block size−1=b_right; and write LSBs and signs "1. LSB+Sign Spec" of the spectral data, starting from the left end of the side info, from right to left, up to b_left+block size. Note, that b_left and bright are not known in advance.
5. The border b_left+block size−1=b_right is determined, when the two pointers reading "1. MSB Spec$_{arith}$" and "1. LSB+Sign Spec" meet each other (see arrows in FIG. 3E).
6. Continue writing MSBs "2. MSB Spec$_{arith}$" of the spectral data, starting from the left border of the bitstream payload, from left to right; and continue writing LSBs and signs "2. LSB+Sign Spec" of the spectral data, starting from block_size−1, from right to left.
7. Write residual, starting from the left end of the LSBs and signs of the spectral data, from right to left.

The reading on decoder side can be done similar to the described writing on the encoder side.

FIG. 3 illustrates this process of writing or reading the rearranged bitstream payload. FIG. 3A shows the 'normal' bitstream payload, whereas FIG. 3B shows the rearranged bitstream payload. As outlined above, this rearranged bitstream payload can immediately be written or read. Alternatively, a rearrangement can also be performed as a post-process on encoder side or as a pre-process on the decoder side. However, the bitstream needs to be parsed for this rearrangement process as follows:

Original order→rearranged order: b_left and b_right need to be found by counting the remaining bits to be written—the borders are reached, if this number equals block size.

Rearranged order→original order: b_right needs to be found by observing the pointers reading "1. MSB Spec$_{arith}$" and "1. LSB+Sign Spec"—the border is reached, when both pointers meet each other.

While the range of bits representing the psychoacoustically less important bits is predetermined by the channel codec, b_left and b_right could be on an arbitrary bit position.

In one embodiment, the arithmetic encoder/decoder operates on byte granularity. In this example, b_left already falls to a byte boundary. This is reflected in FIG. 3A, where b_left=184.

Since, however, the underlying channel coder (FIG. 3C) operates on nibble (4 bits) granularity, block_size might not be a multiple of bytes and thus b_right might also not fall on a byte boundary. In this case, a mismatch will occur after the rearrangement as described above. In the given example, such mismatch is visible in byte 17 [128:135] (FIG. 3E), where the arithmetic decoder would have to start decoding at bit position 132, which is not a byte boundary.

To cope with this, the block_size is now derived as:

$$\text{block\_size} = 8 \left\lceil \frac{N_{pc}}{2} \right\rceil$$

Figure 4:
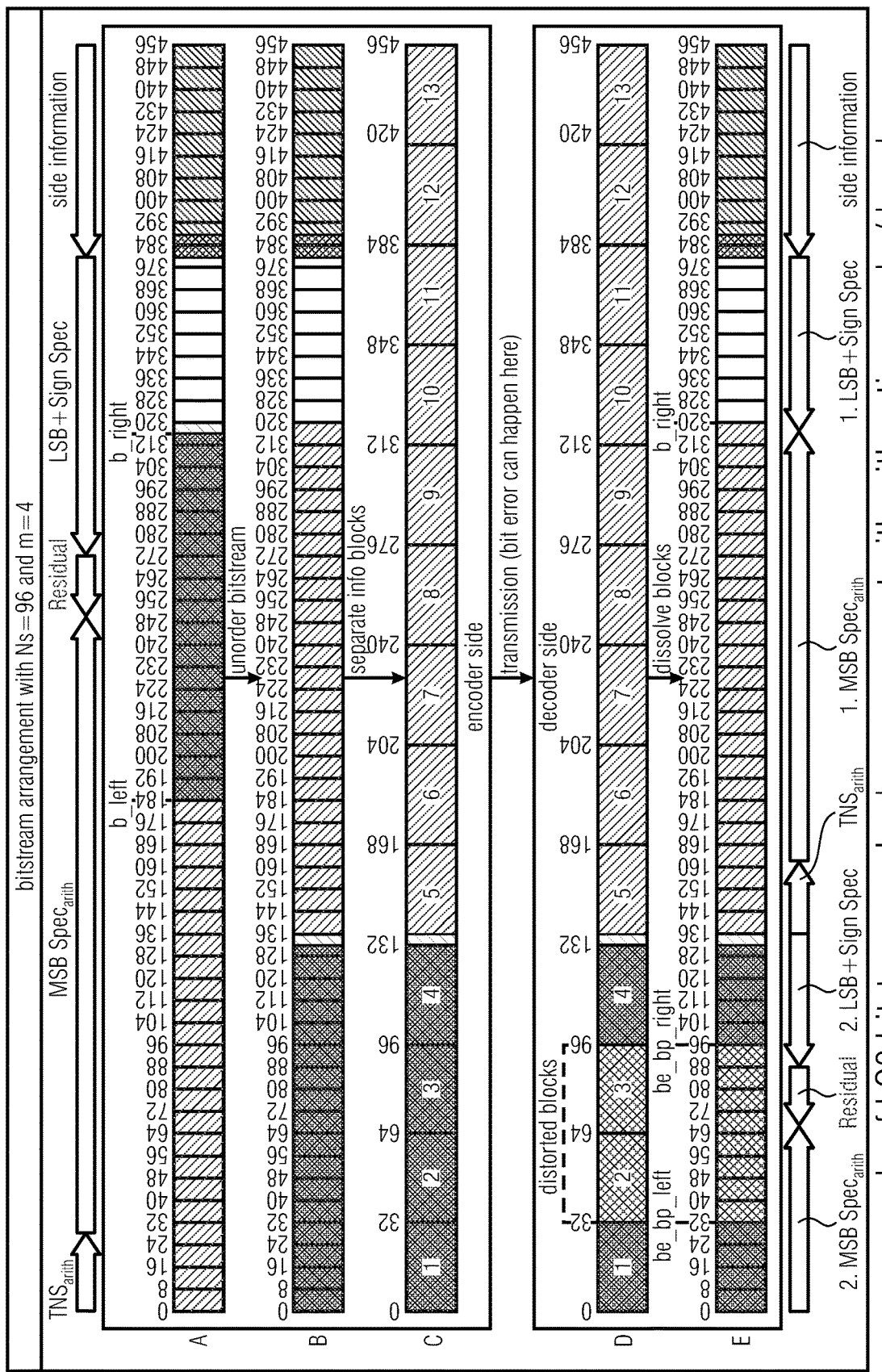
FIG. 4 illustrates another example of an LC3 bitstream payload rearrangement with an arithmetic encoder/decoder operating on byte granularity.

FIG. 4 shows an example on this embodiment, considering the same parameters as given in FIG. 3. Here, block_size=136 bits, i.e. b_right is now also on a byte boundary, leading to the starting point of the arithmetic decoder at the bit position 136, resulting at the integer byte position 17 (FIG. 4E, the arithmetic decoder starts with decoding TNS$_{arith}$) The right nibble of byte 17 [132:135] (displayed striped in blue-white) now contains bits being treated as psychoacoustically less important, although it is assigned to a codeword intended to cover psychoacoustically more important data. This has the following effects:

If there were uncorrectable bit errors in codeword 5, the whole frame would be synthesized with full frame loss concealment even if the errors only affect the right nibble of byte 17, i.e. bits [132:135].

If the codewords 5 to 13 are good and there are uncorrectable bit errors in codeword 4, which may be just located in the left nibble of byte 17, i.e. bits [128:132], then the right nibble of byte 17 can still be decoded, as it is coded in the good codeword 5.

It is noted, that b_left might shift slightly to the next left byte boundary, if it is not already on a byte boundary like in the example given in FIG. 3.

The number of spectral tuples belonging to the psychoacoustically less important data might slightly increase, whereas the number of spectral tuples belonging to the psychoacoustically more important data might correspondingly slightly decrease. Therefore, in some impaired situations, it can happen that the number of frequency tuples that can be decoded is less than in the nibble/bit granularity case. However, quality wise this will have a marginal influence, but allows for a more efficient implementation of the arithmetic encoder/decoder.

Although the above example addresses the situation, where the granularities are in an integer relation to each other, an analogous processing is used in case of non-integer relations of the granularities or in case of the arithmetic encoder granularity being lower than the error protection granularity.

A feature of the advantageous approach for a bitstream rearrangement (separation of psychoacoustically less important from psychoacoustically more important bits) is, that the bits are written or read chronologically—but not spatially—by the audio encoder/decoder, starting with the high important bits and ending with the low important bits, since two bitstream writers write simultaneously into the bitstream, or two bitstream readers read simultaneously out of the bitstream (in the present case in different directions), and that—due to the variable length coding—no a-priori information is given, where those two writing or reading pointers are located, when a certain amount of data is written or read. Such locations are just known once this amount of data is written, or once this amount of data is parsed (i.e. read and evaluated)—either, because a certain amount of data is written or read, or because the two pointers have met each other during writing or reading.

Although a rearrangement as a post- or preprocess is possible after the encoding step or prior to the decoding step, a direct writing or reading of the rearranged bitstream is of advantage, since the rearrangement uses an additional parsing step.

Subsequently, embodiments of the present invention that are related to the decoder or receiver side are discussed with respect to FIGS. 13 to 20.

Figure 13:
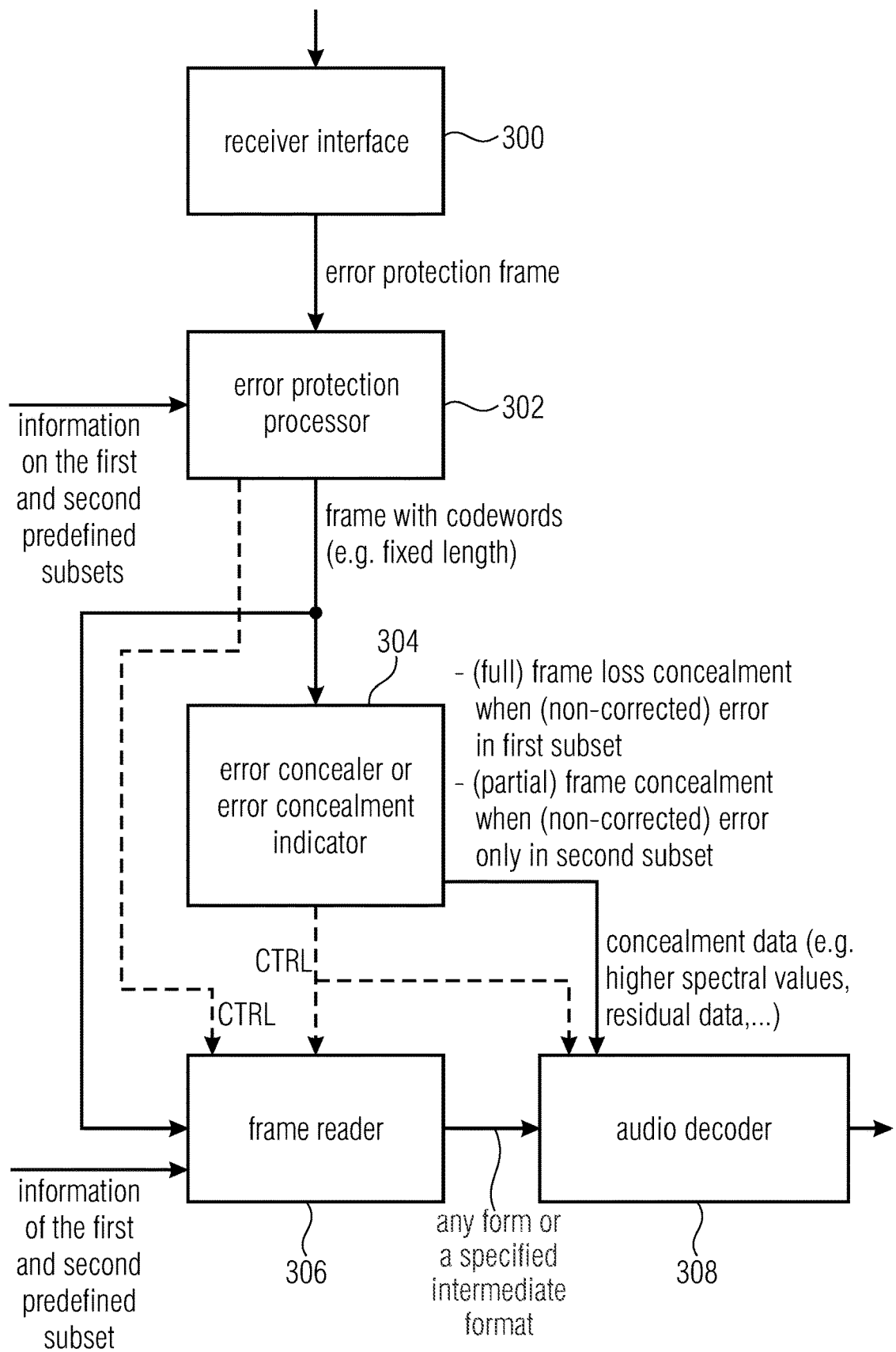
FIG. 13 illustrates an implementation of the audio receiver processor in accordance with the present invention.

FIG. 13 illustrates an audio receiver processor for processing a received error protected frame. The audio receiver processor comprises a receiver interface 300 for receiving the error protected frame and for outputting the error protected frame to an error protection processor 302. The error protection processor 302 is configured for processing the error protected frame to obtain an encoded audio frame. Particularly, the error protection processor receives information on the first or the second predefined subset and advantageously, only from the first predefined subset and, even only on the codewords belonging to the first predefined subset. This information is sufficient so that the error protection processor 302 can check whether a predefined subset of the codewords of the encoded audio frame derived from the error protection processor 302 comprises an error.

The error protection processor 302 processes the error protected frame, outputs a frame with codewords and additionally generates an information whether the frame with codewords that is typically a fixed length frame has an error within the first predefined subset of the codewords.

In this context, it is to be mentioned that the codewords input into the error protection coder 508 of the audio transmitter processor of FIG. 5 or the codewords output by the error protection processor 302 of the audio receiver processor can also be considered to be payload codewords, and that the codewords output by the error protection processor 302 of the audio receiver processor or the codewords input into the error protection coder 508 of the audio transmitter processor of FIG. 5 are termed just codewords.

The audio receiver processor comprises an error concealer or error concealment indicator 304 configured to perform a frame loss concealment operation in case of a detected error in the first predefined subset of the codewords or to generate an indication for such an error concealment operation to be performed at e.g. a remote place.

The audio receiver processor comprises a frame reader 306 and a subsequently connected audio decoder 308. The frame reader 306 can be controlled by the error protection processor 302 or the error concealer or the error concealment indicator 304. Particularly, in case the error protection processor 302 determines an error in the first predefined subset of the codewords which results in a typically full frame loss concealment, the frame reader 306 and the audio decoder 308 may be controlled in such a way that these blocks do not have to operate for this frame anymore.

In case the error protection processor 302 determines an error in the second predefined subset of the codewords but not in the first predefined subset of the codewords, the frame reader 306 is controlled to read in the first predefined subset of the codewords but a reading of the second predefined subset of the codewords can be skipped, since an error has been detected or at least a reading of a certain codeword in which an error has been detected can be skipped if not all codewords of the second predefined subset of the codewords are erroneous.

In case the error protection processor 302 has determined that both subsets of codewords are error free, i.e., do not contain any error that has not been corrected by the error protection processor procedure, the frame reader 306 is configured to read the encoded audio data in the first and second predefined subsets using predefined information on the first and second predefined subsets and the frame reader 306 may output the read audio data in any form or a specified intermediate format for the purpose of processing by the audio decoder 308.

When the error concealer or the error concealment indicator 304 has been controlled by the error protection processor 302 to perform a partial frame loss concealment, the error concealer may generate synthesis audio data and forward the synthesis audio data to the audio decoder 308 so that the audio decoder can use this concealment data such as higher spectral values or residual data instead of the transmitted but error-affected audio data in the second set of second codewords. Depending on the implementation, the error concealer or the error concealment indicator 304 or frame loss concealer in FIG. 13 uses data from one or more earlier frames, and the concealer 304 can be integrated into the audio decoder so that both functionalities are integrated into each other. In case of the error concealment indicator, the concealment is done at a place remote from the error protection processor, and the audio decoder receives an indication to perform the concealment from device 304.

Advantageously, the error protected frame has two stages of error protection. The first stage of error protection is the redundancy introduced by the block coder such as the Reed-Solomon encoder on the transmitter side. The further and second line of protection is the calculation of one or more Hash codes over the first predefined subset of the codewords on the one hand and the second predefined subset of the codewords on the other hand.

Although the error protection processor and, particularly, the block code such as the Reed-Solomon code applied by the error protection processor can detect and correct several errors, the case may be that some errors survive the Reed-Solomon decoding without any detection and without any correction or that the error correction has "corrected" errors in the wrong direction. In order to find these errors as well, a Hash verification is performed using a transmitted Hash output by the Reed-Solomon decoding operation and a comparison of this transmitted Hash value with a Hash value derived from the decoded first (or second) predefined subsets of codewords.

Figure 14:
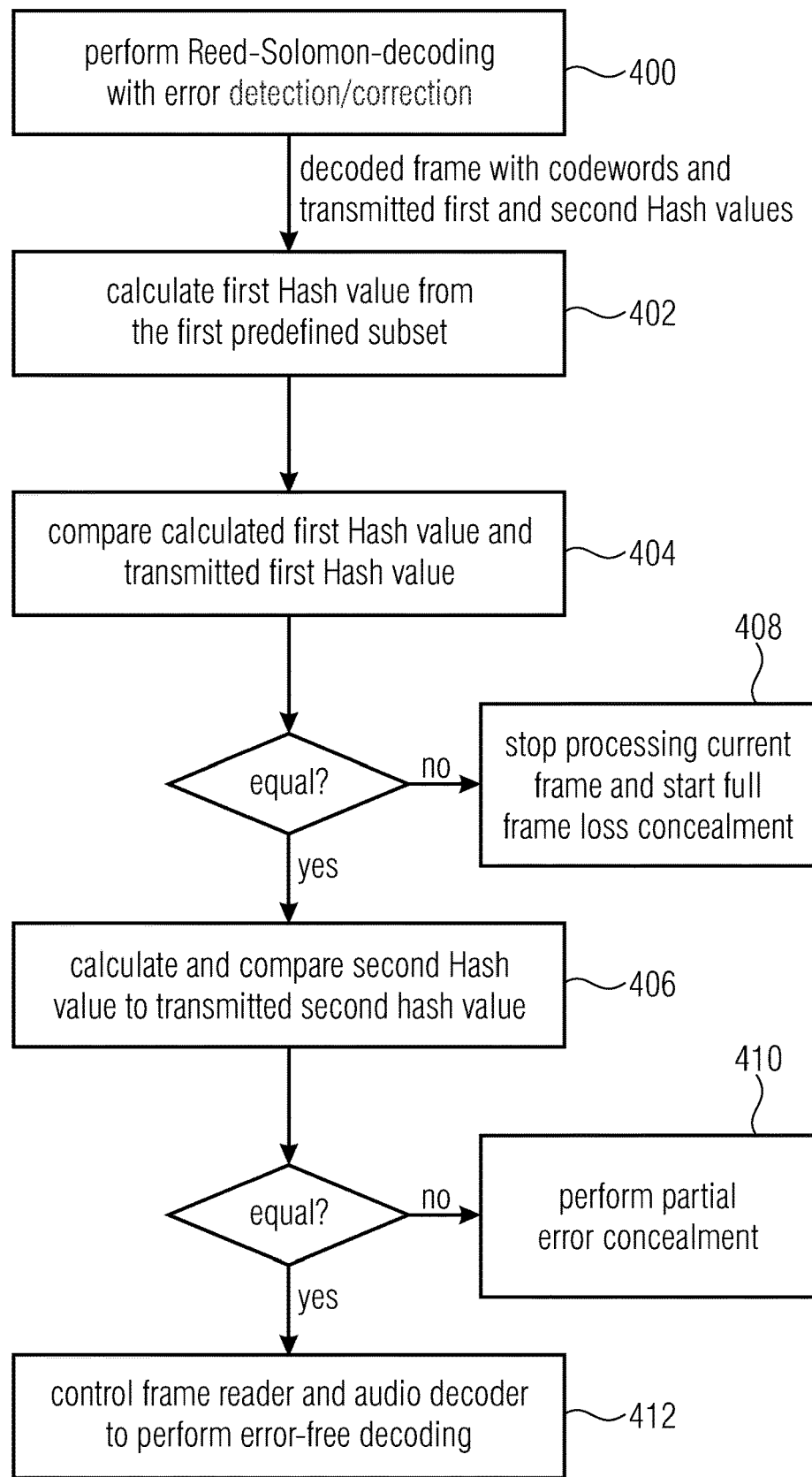
FIG. 14 illustrates a procedure of the error protection processor and the error concealer.

An implementation is illustrated in FIG. 14. In step 400, a Reed-Solomon decoding with an error detection/correction is performed. This procedure results in a decoded frame with codewords and transmitted first and second result values that may be implemented as Hash values. In step 402, a first Hash value is calculated from the first predefined subset and in step 404, the calculated first Hash value is compared to the transmitted first Hash value. In case both Hash values are equal, the procedure goes on to step 406. However, in case both Hash values are not equal, an error has been detected and the processing is stopped and a full frame loss concealment is started as indicated in step 408.

However, when it has been determined that the first Hash value and the transmitted first Hash value are equal to each other, step 406 is performed in which the second Hash value is calculated and compared to the transmitted second Hash value. In case both Hash values are not equal, than the procedure indicated in step 410 is applied, i.e., a partial frame loss concealment is performed. When, however, it is determined that both Hash values with respect to the second predefined subset of the codewords are equal, the frame reader and the audio decoder are controlled to perform an error-free decoding operation. The procedure illustrated in FIG. 14 may be implemented by the error concealer or error concealment indicator 304 and/or by the error protection processor 302.

Figure 15:
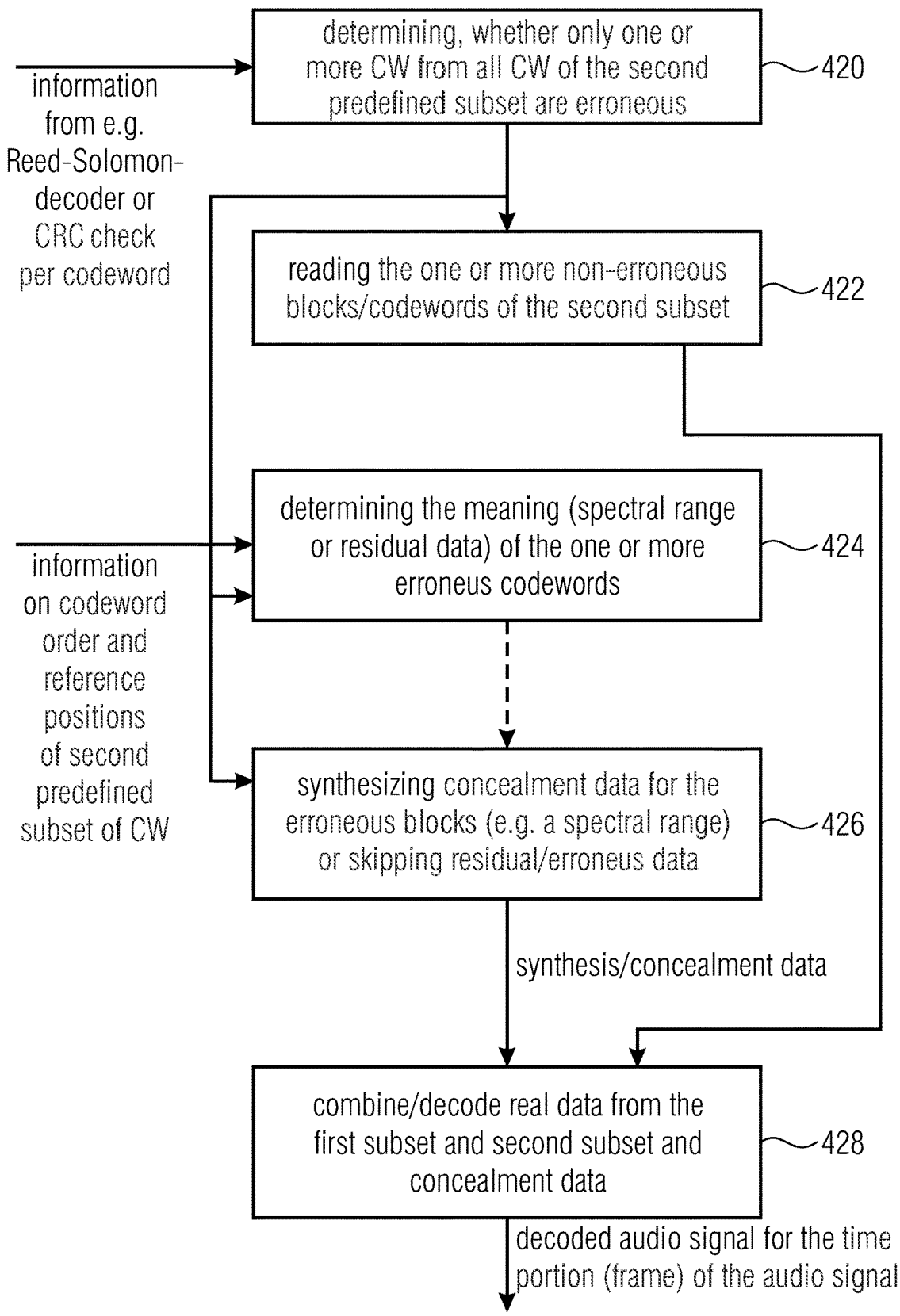
FIG. 15 illustrates a further implementation of the error protection processor and the error concealer.

FIG. 15 illustrates an implementation of partial frame loss concealment illustrated in block 410 of FIG. 14. In step 420, it is determined whether only one or more codewords from all the codewords of the second predefined subset of the codewords are erroneous. To this end, an information is received from, for example, the block decoder such as the Reed-Solomon decoder or a CRC check per codeword. Typically, the Reed-Solomon decoder will indicate that or which codeword of the second predefined subset of the codewords is erroneous. It is, for example, indicated by block 420 that only one or two codewords are erroneous and other codewords of the second set of predefined codewords are correct. The data of these other non-corrupted codewords is used as much as possible for the normal decoding or the partial concealment. In step 422, the one or more non-erroneous blocks or codewords of the second subset are read.

In step 424 it is determined, which meaning such as the spectral range or the residual data is reflected by the one or more erroneous codewords. To this end, an information on codeword order and reference positions of the second predefined subset of the codewords is useful. Step 424 determines the meaning of the erroneous codewords so that step 426 can synthesize concealment data for the erroneous blocks such as the spectral range determined by block 424. Alternatively, a kind of error concealment may also be that residual data that have been indicated as corrupted are simply skipped so that the residual decoding and the corresponding quality improvement that would be obtained in case of non-erroneous codewords is simply not performed as a kind of an error concealment procedure in a non-problematic situation where only the residual data are corrupted.

However, in case of a determination that a certain spectral range is corrupted, concealment data for this spectral range is generated by block 426.

In block 428 the read data from the first predefined subset and the correct data from codewords of the second predefined subset and the concealment data are combined and decoded in order to finally obtain the decoded audio signal for the time portion (frame) of the audio signal resulting from a partial frame loss concealment procedure.

Figure 16:
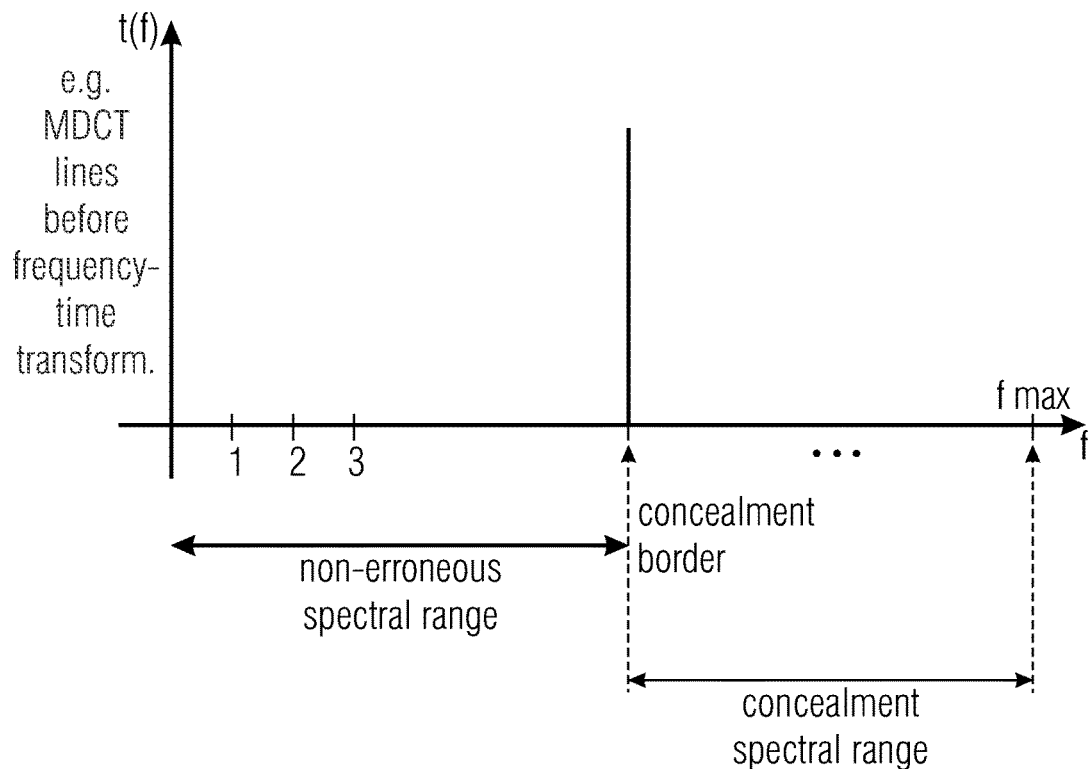
FIG. 16 illustrates a schematic representation of the concealment spectral range for a partial frame loss concealment.

FIG. 16 illustrates a general representation of the procedure performed by block 424. By parsing the bitstream with the erroneous data, the meaning of the data with respect to which spectral values these data represent is determined in order to obtain the concealment spectral range. However, the actual values of these data are not used since they have been determined to be erroneous. The result of the procedure subsequent to steps 424 and 426 will be that non-erroneous spectral range data are obtained until the concealment border and erroneous spectral data that are replaced by synthesis/concealment data exist for the spectral range between the concealment border and the maximum frequency. However, in other embodiments, the case may be that the concealment spectral range does not fully extend to the maximum border but only covers a certain spectral range between the concealment border and another border which is lower than the maximum frequency used by the audio decoder. The audio decoder still receives correctly received data between the concealment border and the maximum frequency.

In an embodiment, the error concealer or error concealment indicator 304 is configured to generate substitute data, and this data is, then, decoded or, in general, used by the decoder together with the non-erroneous data. In another embodiment, the error concealer or error concealment indicator 304 only generates an error concealment indication, and this indication is evaluated by the audio decoder such as the decoder 308 of FIG. 13 as shown by the connection line between block 304 and 308, wherein the connection line carries the error concealment indication. The audio decoder then takes error concealment measures without a specific audio decoding operation (although, generally, the error concealment indication is "decoded" or interpreted) such as using data from earlier frames or heuristic procedures or other related procedures.

Figure 17:
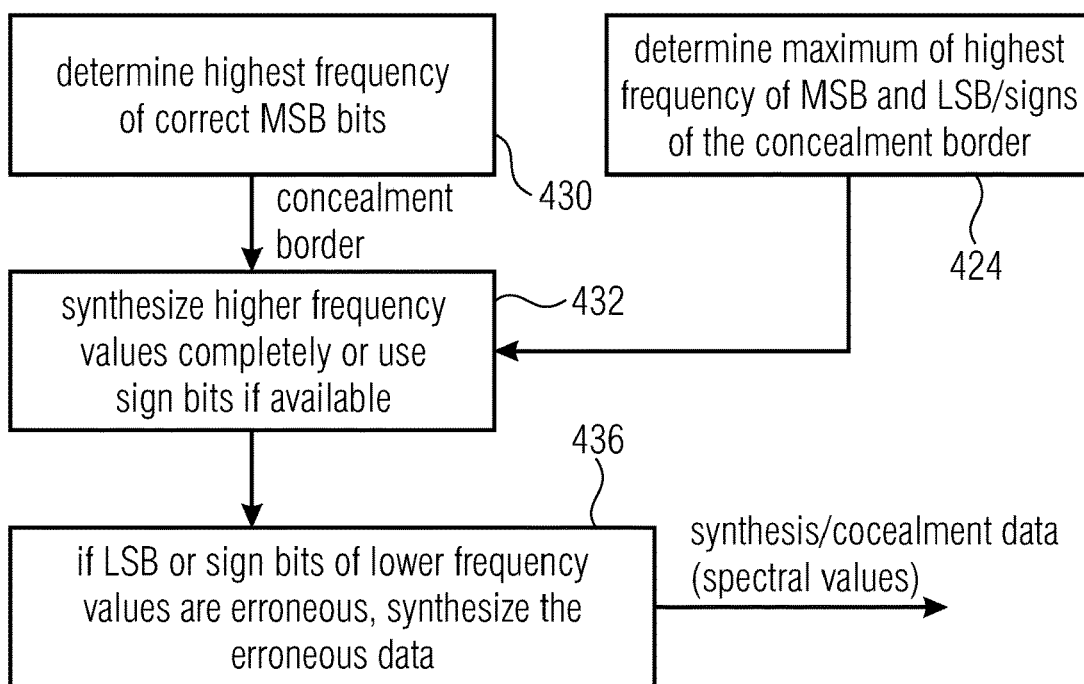
FIG. 17 illustrates a further implementation of a partial frame loss concealment.

FIG. 17 illustrates a situation where data as discussed with respect to FIG. 1, 2, 3 or 4 or as obtained by the audio encoder in FIG. 21 are used. In step 430, the highest frequency that corresponds to the correct most significant bits is determined as the concealment border. Alternatively, a maximum of the highest frequency of the MSB and the LSB/sign bits can also be determined 434 as the concealment border.

In step 432, higher frequency values are synthesized either completely or using probably obtained LSB or sign bits: Although higher frequency MSB bits are corrupted, nevertheless LSB or sign bits are still available for such spectral values corresponding to corrupted MSB bits. In step 436, the erroneous data are also synthesized when erroneous data cover LSB or sign bits of lower frequency values than the concealment border. The output of the synthesis procedure is synthesis/concealment data in the form of spectral values for the concealment spectral range schematically illustrated in FIG. 16.

Figure 18:
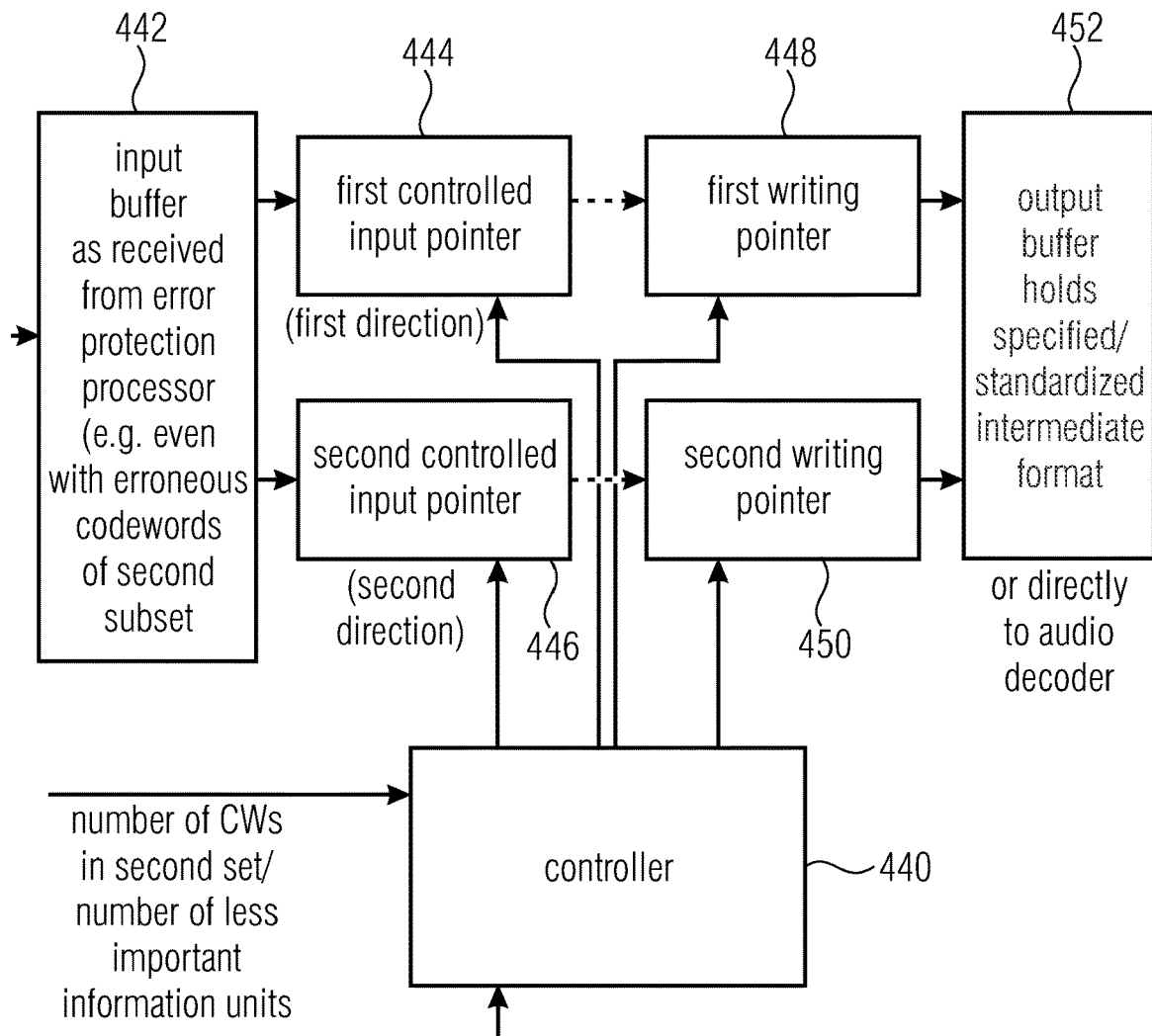
FIG. 18 illustrates an implementation of the frame reader of FIG. 13.

FIG. 18 illustrates an implementation of the frame reader 306 of FIG. 13. The frame reader may comprise an input buffer 442, and an output buffer 452 or a direct output to the audio decoder. The frame reader 306 comprises a controller 440, a first controlled input pointer 444 that operates in a first reading direction and a second controlled input pointer 446 that operates in a second reading direction. The first controlled input pointer 444 may feed the first writing pointer 448 and the second controlled input pointer 446 may feed the second writing pointer 450.

As the corresponding controller on the encoder-side illustrated at 800 in FIG. 8, the controller 440 of the pointer implementation on the receiver side also receives an information on the number of codewords in the second predefined subset or information on the total number or capacity of the psychoacoustically less important information units.

Additionally, the controller 440 may receive an indication of erroneous codewords of the second subset from the error protection processor in case the data from the second predefined subset of the codewords are used as much as possible as discussed with respect to FIG. 17. If this is not the case, and if it is determined that at least one codeword of the second predefined subset of the codewords is erroneous and, therefore, all spectral data that are covered by the second predefined subset of the codewords are generated by the error concealment operation as synthesis or concealment data, any control from the error protection processor to the controller 440 is not required.

Nevertheless, the procedure of the controller 440 is similar to the controller 800 of FIG. 8, but the notion of writing and reading is exchanged. Particularly, the controller 440 in FIG. 18 controls the writing points for example for a data exchange or by writing in increments. The data exchange is done in case of arrangement as is discussed in the context of FIG. 19, while the incrementation/decrementation procedure is performed for the direct decoding illustrated in FIG. 20.

The controller 440 sets the first and second pointers' start position/addresses in a frame for the first amount of information units and then synchronously increments/decrements the input (reading) pointers. The controller 440 detects that all codewords of the first subset are read from the input buffer and subsequently sets the first and second pointers' start position/addresses for the second amount of information units and synchronously increments/decrements the reading pointers until all remaining data are read.

In a first example case, the data written into the output buffer 452 are requested from the decoder, since only the decoder, and particularly the entropy decoder and/or residual decoder knows, how much information units or bits are used from which pointer. In an example, the decoder receives LSBs and Signs for a spectral line or a spectral line tuple from the first writing pointer 448 and MSBs for this same spectral line or spectral line tuple from the second writing pointer 450 as used by the entropy decoder.

In a second example case, the data are to be written into a certain frame. Then, the controller applies a syntax controlled bitstream or frame reader for reading the bits from the input buffer 442 via the pointers 444, 446 based on a certain frame syntax and the data is then written into the output buffer 452 or into a transmission device via blocks 448 and 450. In an example, the syntax controlled bitstream or frame reader reads via e.g. pointer 446 LSBs and Signs for a spectral line or a spectral line tuple and the read data is written into the buffer 452 via block 450 and the syntax controlled bitstream or frame reader reads via e.g. pointer 448 MSBs for this same spectral line or spectral line tuple and the read data is written into the output buffer 452 via block 448.

Hence, in an embodiment, the audio decoder 308 of FIG. 13 typically comprises a parser and a renderer. The parser would be consist of block 71 and 72 of FIG. 22 and the renderer would include the remaining blocks of FIG. 22, since in this embodiment, one cannot determine without arithmetic or generally entropy decoding how many encoded bits are used for e.g. the MSB portion of a line or a line tuple or for the MSB/Sign portion of the line or the line tuple. In case of a transcoding operation, the parser is used without a subsequent renderer, since the transcoding operation outputs a frame written with a different syntax compared to the input frame.

Figure 19:
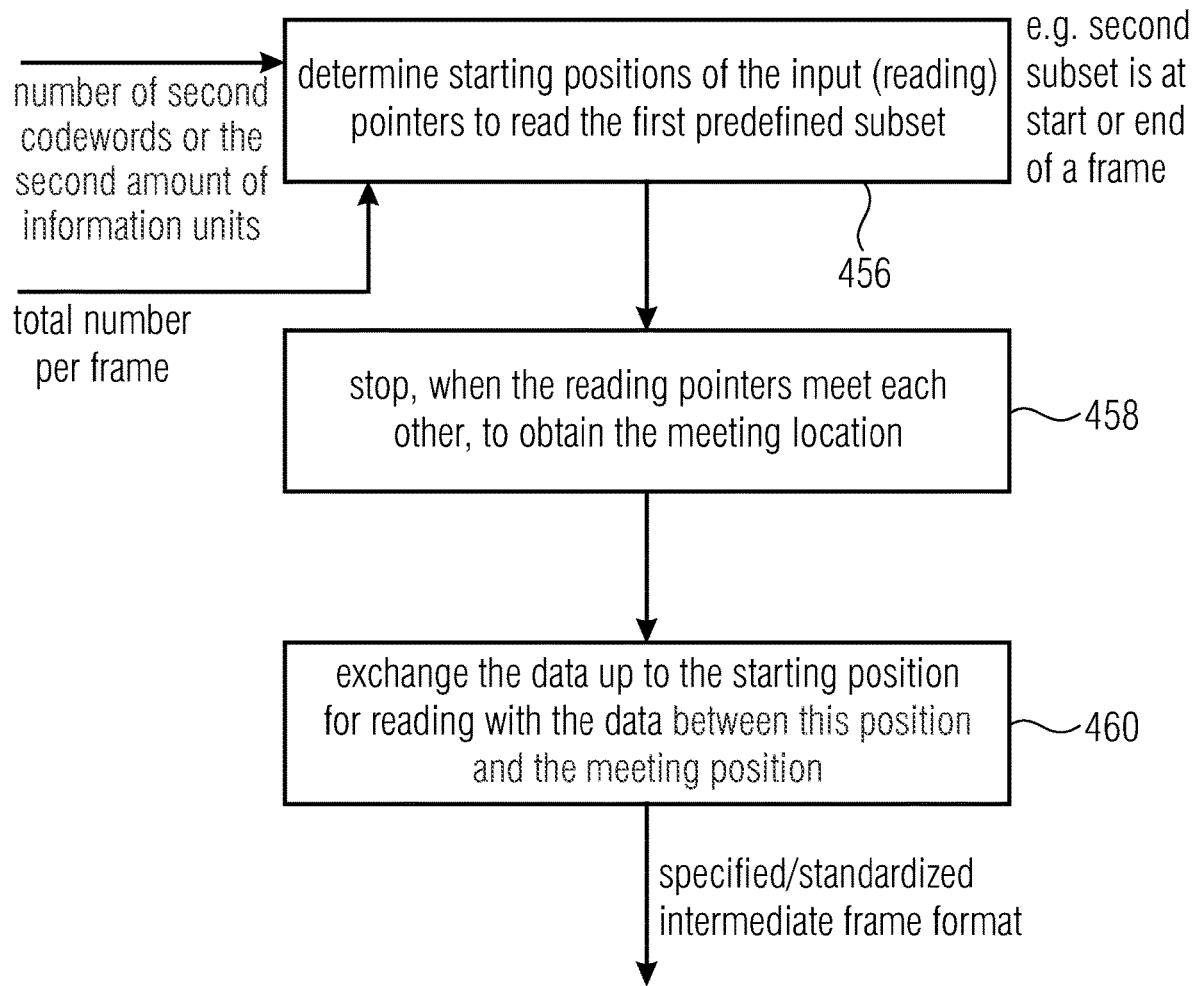
FIG. 19 illustrates an implementation of the frame reader for performing a rearrangement of received data into a frame format used by a specific standard, such as standardized audio decoder.

FIG. 19 illustrates an implementation, when, for example, the controller 440 or, generally, the frame reader 306 of FIG. 13 performs a rearranging operation. In step 456, the starting positions of the input (reading) pointers are determined to be so that the first predefined subset of the codewords is read. In this procedure it is, for example, the case that the second subset of the codewords is collected in adjacent codewords at the start or the end of a frame. Step 456 receives, as an input, the number of second codewords or the second amount of information units. Additionally, in case the second predefined subset of the codewords is located at the end of the frame, the total number of information units per frame is used by step 456 as well.

In step 458, the procedure stops, when the reading pointers meet each other and, at this event, the meeting location in the frame is determined. In step 460, the data up to the starting position for reading is exchanged with the data between this position and the meeting position.

At the output of block 460, one has obtained the specified/standardized intermediate frame format.

Figure 20:
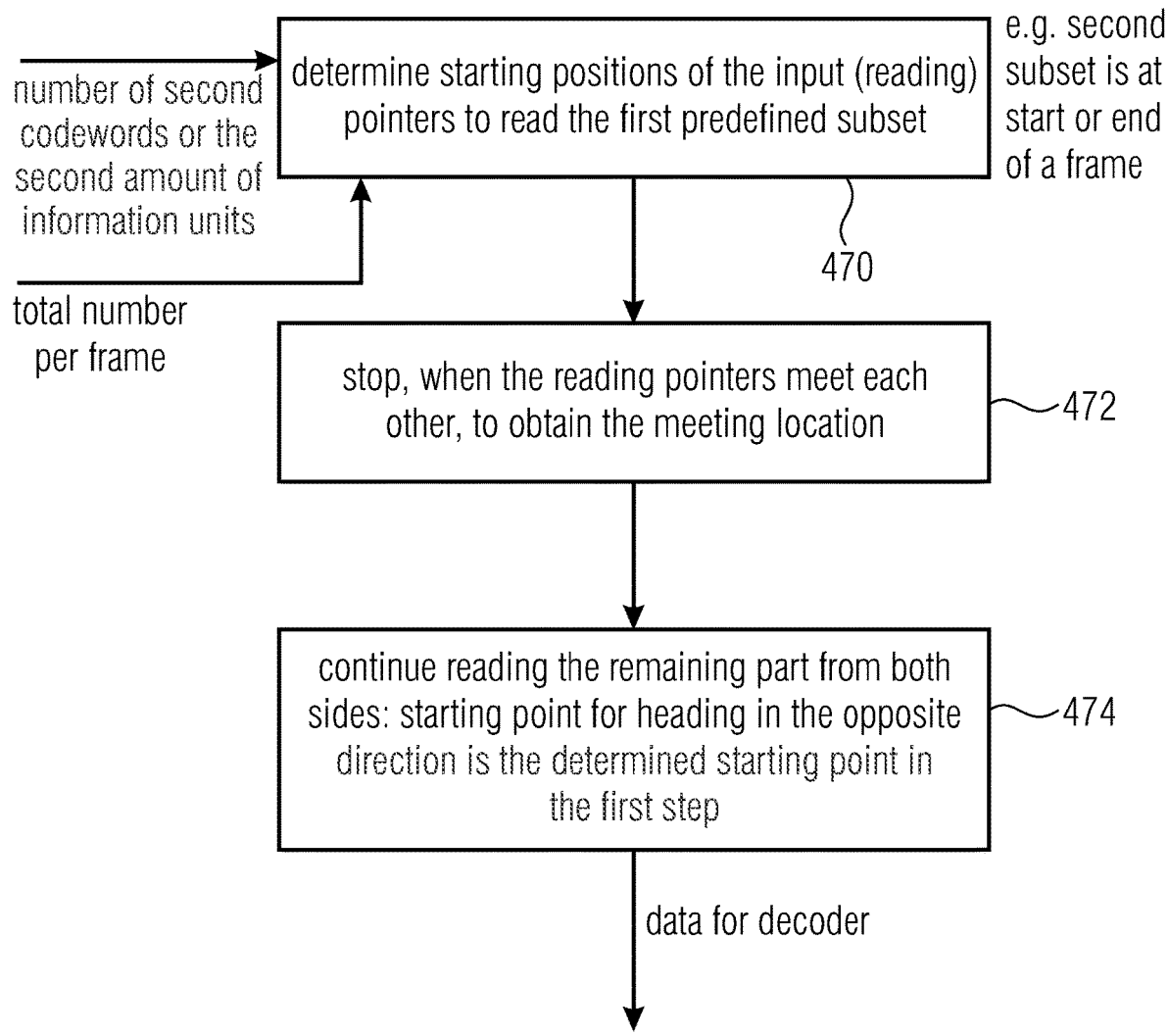
FIG. 20 illustrates a procedure done by the frame reader for a direct reading of the audio data of the error protected frame.

FIG. 20 illustrates the procedure of the frame reader 306 for the purpose of direct decoding. Step 470 once again receives the number of second codewords or the second amount of information units. Step 470 may use the total number of information units per frame. Then, the starting positions of the input (reading) pointers are determined to read the first predefined subset. Step 470 as well as step 456 control the reading pointers 444, 446. In step 472, the procedure stops, when the reading pointers meet each other and the meeting location is obtained. In step 474, the reading is continued over the remaining part from both sides, where the starting point for reading in the opposite direction is the determined starting point in the first step. At the output of block 474, one obtains the data for the audio decoder for the direct decoding application.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

BIBLIOGRAPHY

[1] "ISO/IEC14496-3 MPEG-4 Information technology—Coding of audio-visual objects—Part 3: Audio," 2009.
[2] "ETSI ES 201 980 Digital Radio Mondiale; System Specification," 2014.
[3] "ETSI TR 103 590 V1.1.1 (2018-09) "Digital Enhanced Cordless Telecommunications (DECT); Study of Super Wideband Codec in DECT for narrowband, wideband and super-wideband audio communication including options of low delay audio connections (lower than 10 ms framing)".

What is claimed is:

1. An audio receiver processor for processing an error protected frame, comprising:
a receiver interface for receiving the error protected frame to acquire a received error protected frame;
an error protection processor for processing the received error protected frame to acquire an encoded audio frame, wherein the error protection processor is configured to check whether a codeword of a first predefined subset of codewords of the encoded audio frame comprises an error, and an error concealer configured to perform a frame loss concealment operation in case of a detected error in the first predefined subset of the codewords, or an error concealment indicator configured to generate a frame loss concealment indication in case of a detected error in the first predefined subset of the codewords, wherein the error protection processor is configured to apply a block decoding operation to the received error protected frame to acquire the first predefined subset of the codewords and a decoded second predefined subset of the codewords, wherein, if the block decoding operation does not signal that an error exists, the error protection processor is configured to calculate a first Hash value from the first predefined subset of the codewords, and to compare the first Hash value to a received first Hash value, wherein the error protection processor is configured to determine that an error exists in the first predefined subset of the codewords when the first Hash value and the received first Hash value do not coincide with each other or to determine that the first predefined subset of the codewords is error-free when the first Hash value and the received first Hash value coincide, or wherein the error protection processor is configured to apply a block decoding operation to the received error protected frame to acquire the first predefined subset of the codewords and a decoded second predefined subset of the codewords, wherein, if the block decoding operation does not signal that an error exists, the error protection processor is configured to calculate a second Hash value from the decoded second predefined subset of the codewords, and to compare the second Hash value to a received second Hash value, wherein the error protection processor is configured to determine that an error exists in the decoded second predefined subset of the codewords when the second Hash value and the received second Hash value do not coincide with each other or to determine that the decoded second predefined subset of the codewords is error-free when the second Hash value and the received second Hash value coincide.

2. The audio receiver processor of claim 1,
wherein the error protection processor is configured to check whether the decoded second predefined subset of codewords of the encoded audio frame comprises an error, and
wherein the error concealer is configured to perform a partial frame loss concealment operation for concealing the error in the decoded second predefined subset of the codewords, or wherein the error concealment indicator is configured to generate a partial frame loss concealment indication for concealing the error in the decoded second predefined subset of the codewords.

3. The audio receiver processor of claim 1, further comprising an audio decoder for decoding the encoded audio data comprised in the first predefined subset of the codewords, wherein the audio decoder is configured to be controlled by the error protection processor to perform decoding when the error protection processor does not locate an error in the first predefined subset of the codewords.

4. The audio receiver processor of claim 1, wherein the block decoding operation comprises a Reed-Solomon decoding operation.

5. The audio receiver processor of claim 1,
wherein the error protection processor is configured to check whether the decoded second predefined subset of the codewords comprises an error only when the check of the first predefined subset of the codewords did not detect an error.

6. The audio receiver processor of claim 1,
wherein the error protection processor is configured to detect, whether one or more specific codewords of the decoded second predefined subset of the codewords comprises an error, and whether any codeword of the decoded second predefined subset of the codewords is an error-free codeword, and
wherein the error concealer is configured to generate substitute data for the one or more specific codewords or an error concealment indication, and
wherein the audio receiver processor comprises an audio decoder for decoding audio data comprised in the first predefined subset of the codewords and audio data comprised in one or more of the error-free codewords of the decoded second predefined subset of the codewords, and the substitute data for the one or more specific codewords, or
wherein the audio receiver processor comprises an audio decoder for decoding audio data comprised in the first predefined subset of the codewords and audio data comprised in one or more of the error-free codewords of the decoded second predefined subset of the codewords, and wherein the audio decoder is configured to receive the error concealment indication and to take an error concealment measure in response to the error concealment indication.

7. An audio receiver processor for processing an error protected frame, comprising:
a receiver interface for receiving the error protected frame to acquire a received error protected frame;
an error protection processor for processing the received error protected frame to acquire an encoded audio frame, wherein the error protection processor is configured to check whether a codeword of a first predefined subset of codewords of the encoded audio frame comprises an error,
an error concealer configured to perform a frame loss concealment operation in case of a detected error in the first predefined subset of the codewords, or an error concealment indicator configured to generate a frame loss concealment indication in case of a detected error in the first predefined subset of the codewords; and
a frame reader configured for reading the encoded audio frame in accordance with a predefined frame-reading procedure identifying the first predefined subset of the codewords and a second predefined subset of the codewords.

8. The audio receiver processor of claim 7,
wherein the frame reader is configured to read information units of a first amount of information units starting at reference points of codewords of the first predefined subset of the codewords until the information units from all codewords of the first predefined subset of the codeword are read, and
to read information units of a second amount of information units starting at reference points of codewords of the second predefined subset of the codewords,
further comprising an audio decoder, wherein the audio decoder is configured to decode a concatenation of the first amount of information units of the first amount of information units and the second amount of information units in order to acquire decoded audio data for the encoded audio frame.

9. The audio receiver processor of claim 7,
wherein the frame reader is configured to use, as the second subset of the codewords, a second predefined number of adjacent codewords at one side of the codeword frame of the encoded audio data, to use, as the first predefined subset of the codewords, a first predefined number of adjacent codewords at another side of the codeword frame of the encoded audio data, and wherein a sum of the first predefined number and the second predefined number is equal to the predefined total number of codewords, or
wherein at least one codeword of the second predefined subset of the codewords is located between two codewords of the first predefined subset of the codewords or vice versa.

10. The audio receiver processor of claim 7,
wherein the frame reader is configured to read information units of a first amount of information units in a first reading direction starting at reference positions of at least two codewords of the first predefined number of codewords, and in a second reading direction starting at reference positions of at least two other codewords of the first predefined number of codewords, wherein the second reading direction is opposite to the first reading direction, or
wherein the frame reader is configured to read information units of a second amount of information units in a first reading direction starting at reference positions of at least two codewords of the second predefined number of codewords and in a second reading direction starting at reference positions of at least two other codewords of the second predefined number of codewords, wherein the second reading direction is opposite to the first reading direction.

11. The audio receiver processor of claim 7,
wherein the frame reader is configured to read information units of a first amount of information units and a second amount of information units, wherein at least a majority of the information units of the first amount of information units is psychoacoustically more important than a majority of the information units of the second amount of information units, or
wherein only a partial frame loss concealment is performed by the error concealer when only information units in a second amount of information units are determined as corrupted and wherein a full frame loss concealment is performed by the error concealer when information units in a first amount of information units are determined as corrupted.

12. The audio receiver processor of claim 7, further comprising a source decoder for decoding at least two categories of information units, the at least two categories being selected from the group comprising of fixed length side information, variable length side information, temporal noise shaping information, one or more most significant bits of a spectrum of a first frequency portion of the spectrum, one or more most significant bits of a second frequency portion comprising higher frequencies than the first frequency portion, one or more least significant bits or sign bits of a first frequency portion, one or more least significant bits or sign bits of a second frequency portion, the second frequency portion comprising higher frequencies than the first frequency portion, and residual bits,
wherein, if available for decoding by the source decoder as a first category of the at least two categories, at least one of the fixed length side information, the variable length side information, the temporal noise shaping information, the one or more most significant bits of a spectrum of the first frequency portion, and the least significant bits or sign bits of a first frequency portion are located in a first amount of information units, and wherein, if available for decoding by the source decoder as a second category of the at least two categories, at least one of the one or more most significant bits of the second frequency portion, the one or more least significant bits or sign bits of a second frequency portion and the residual bits are located in a second amount of the information units.

13. The audio receiver processor of claim 7, wherein the frame reader is configured
to use a first reading pointer and a second reading pointer,
to increment the first reading pointer in a direction from a lower information unit position in a codeword frame to a higher information unit position in a codeword frame,
to decrement the second reading pointer in a direction from a higher information position in the codeword frame to a lower information position in the codeword frame,
to start the first reading pointer at a reference position indicating a start of a first codeword in a predefined sequence of codewords of the first predefined subset of the codewords,
to start the second reading pointer at a reference position indicating an end of a last codeword in the predefined first sequence of codewords of the predefined first set of codewords,
to read information units belonging to one or more first categories of information units from the first amount of information units at the positions indicated by the first reading pointer, and
to read information units belonging to one or more second categories of information units from a first amount of information units at the position indicated by the second reading pointer until the first reading pointer and the second reading pointers meet each other at a meeting information unit position,
wherein an information unit at the meeting information unit position represents a border between the first amount of information units and a second amount of information units.

14. The audio receiver processor of claim 13,
wherein the frame reader is configured to set the first reading pointer to a reference position indicating a start of a first codeword of a second predefined sequence of codewords of the second predefined subset of the codewords,
to set the second reading pointer to a reference position indicating the end of a last codeword of the second predefined sequence of codewords of the second predefined subset of the codewords, and
to read information units of one or more third categories from the second amount of information units using the first reading pointer and to read information units of one or more fourth categories from the second amount of information units using the second reading pointer.

15. The audio receiver processor of claim 13,
wherein the frame reader is configured to use, as the one or more first categories, most significant bits derived from spectral values ordered in an ascending order with respect to frequency until a spectral value or a combination of spectral values at the meeting information unit, to use, as the one or more second categories, least significant bits or sign bits derived from spectral values until the spectral value or the combination of spectral values of the meeting information unit;

to use, as one or more third categories, one or more most significant bits associated with a frequency at or above the value at the meeting information unit; and to use, as one or more fourth categories, least significant bits or sign bits associated with frequencies at or above the frequency value associated with the meeting information unit.

16. The audio receiver processor of claim 15, wherein the frame reader is configured to read the one or more first categories and the one or more second categories, or to read the one or more third categories and the one or more fourth categories in synchrony with each other, so that the at least one or more most significant bits of a spectral value or a combination of spectral values are read by the first reading pointer and the one or more least significant bits or sign bits of the same spectral value or of the same combination of spectral values are read, before information units from a further spectral value or a further combination of spectral values is read by the reading pointers.

17. The audio receiver processor of claim 7, wherein the frame reader is configured to use a first reading pointer with a first reading direction and a second reading pointer with a second reading direction, wherein the encoded audio frame comprises a frame start position and a frame end position, wherein the frame reader is configured to set the first reading pointer at the first pointer start position derived from a number of information units comprised in the second predefined subset of the codewords and to set the second reading pointer at the frame end position, wherein the first predefined subset of the codewords are all located at a side of the encoded audio frame comprising the frame end position, wherein the frame reader is configured to read using incrementing the first reading pointer and decrementing the second reading pointer in corresponding reading directions, to stop, when the first reading pointer and the second reading pointers meet each other at a meeting position, and to exchange information units between the frame start position and the first pointer start position with the information units between the first pointer start position and the meeting position so that a rearranged encoded audio frame comprises, in the following order, from the start of the rearranged audio frame, information units read between the first pointer start position and the meeting point, information units of the encoded audio frame between the frame start position and the first pointer start position, and information units of the encoded audio frame between the meeting position and the frame end position, and further comprising an audio decoder preset to decode the rearranged encoded audio frame comprising the encoded audio data in the order of the rearranged encoded audio frame, or further comprising a transmitter device for transmitting the rearranged encoded audio frame to a remote location.

18. The audio receiver processor of claim 7, wherein the frame reader is configured to use a first reading pointer with a first reading direction and a second reading pointer with a second reading direction, wherein the encoded audio frame comprises a frame start position and a frame end position, wherein the frame reader is configured to set the second reading pointer at a second pointer start position derived from a number of information units comprised in the second predefined subset of the codewords and a total number of information units of the encoded audio frame and to set the first reading pointer at the frame start position, wherein the first predefined subset of the codewords are all located at a side of the encoded audio frame comprising the frame start position, wherein the frame reader is configured to read using incrementing the first reading pointer and decrementing the second reading pointer in corresponding reading directions, to stop, when the first reading pointer and the second reading pointers meet each other at a meeting position, and to exchange information units between the frame end position and the second pointer start position with the information units between the second pointer start position and the meeting position, so that a rearranged encoded audio frame comprises, in the following order from a start of the rearranged encoded audio frame, information units between the frame start position and the meeting position, information units of the encoded audio frame between the frame end position and the second pointer starting position, and information units of the encoded audio frame between the meeting position and the second pointer start position.

19. The audio receiver processor of claim 7, further comprising an audio decoder comprising an arithmetic decoder receiving a minimum data size portion in a first granularity of information units, wherein the error protection processor is configured to operate in a second granularity, wherein the first granularity is greater than the second granularity, wherein, at a reference position of a first codeword of the first predefined subset of the codewords, an adaption amount of information units corresponding to a granularity difference between the first and the second granularities is located, wherein the adaption amount of information units together with data located at a reference position of a codeword of the second predefined subset of the codewords forms the minimum data size portion to be input into the arithmetic decoder, and wherein the frame reader is configured to start reading information units for the first predefined subset of the codewords at a position in the first codeword determined by the reference position of the first codeword plus a size of the adaption amount.

20. A method of processing an error protected frame, comprising:

receiving the error protected frame to acquire a received error protected frame;

performing an error protection processing with the received error protected frame to acquire an encoded audio frame, wherein the error protection processing comprises checking whether a codeword of a first predefined subset of codewords of the encoded audio frame comprises an error, and performing a frame loss concealment operation or generating a frame loss concealment indication in case of a detected error in the first predefined subset of the codewords, wherein the performing an error protection comprises applying a block decoding operation to the received error protected frame to acquire the first predefined subset of the codewords and a decoded second predefined subset of the codewords, wherein, if the block decoding operation does not signal that an error exists, the performing an error protection comprises calculating a first Hash value from the first predefined subset of the codewords, and comparing the first Hash value to a received first Hash value, wherein the performing an error protection comprises determining that an error exists in the first predefined subset of the codewords when the first Hash value and the received first Hash value do not coincide with each other or determining that the first predefined subset of the codewords is error-free when the first Hash value and the received first Hash value coincide, or wherein the performing an error protection comprises applying a block decoding operation to the received error protected frame to acquire the first predefined subset of the codewords and a decoded second predefined subset of the codewords, wherein, if the block decoding operation does not signal that an error exists, the performing an error protection comprises calculating a second Hash value from the decoded second predefined subset of the codewords, and comparing the second Hash value to a received second Hash value, wherein the performing an error protection comprises determining that an error exists in the decoded second predefined subset of the codewords when the second Hash value and the received second Hash value do not coincide with each other or determining that the decoded second predefined subset of the codewords is error-free when the second Hash value and the received second Hash value coincide, or wherein the method further comprises reading the encoded audio frame in accordance with a predefined frame-reading procedure identifying the first predefined subset of the codewords and a second predefined subset of the codewords.

21. A non-transitory digital storage medium having stored thereon a computer program for performing, when said computer program is run by a computer, a method of processing an error protected frame, the method comprising:

receiving the error protected frame to acquire a received error protected frame;

performing an error protection processing with the received error protected frame to acquire an encoded audio frame, wherein the error protection processing comprises checking whether a codeword of a first predefined subset of codewords of the encoded audio frame comprises an error, and performing a frame loss concealment operation or generating a frame loss concealment indication in case of a detected error in the first predefined subset of the codewords, wherein the performing an error protection comprises applying a block decoding operation to the received error protected frame to acquire the first predefined subset of the codewords and a decoded second predefined subset of the codewords, wherein, if the block decoding operation does not signal that an error exists, the performing an error protection comprises calculating a first Hash value from the first predefined subset of the codewords, and comparing the first Hash value to a received first Hash value, wherein the performing an error protection comprises determining that an error exists in the first predefined subset of the codewords when the first Hash value and the received first Hash value do not coincide with each other or determining that the first predefined subset of the codewords is error-free when the first Hash value and the received first Hash value coincide, or wherein the performing an error protection comprises applying a block decoding operation to the received error protected frame to acquire the first predefined subset of the codewords and a decoded second predefined subset of the codewords, wherein, if the block decoding operation does not signal that an error exists, the performing an error protection comprises calculating a second Hash value from the decoded second predefined subset of the codewords, and comparing the second Hash value to a received second Hash value, wherein the performing an error protection comprises determining that an error exists in the decoded second predefined subset of the codewords when the second Hash value and the received second Hash value do not coincide with each other or determining that the decoded second predefined subset of the codewords is error-free when the second Hash value and the received second Hash value coincide, or wherein the method further comprises reading the encoded audio frame in accordance with a predefined frame-reading procedure identifying the first predefined subset of the codewords and a second predefined subset of the codewords.

* * * * *